(12) United States Patent
Adamian

(10) Patent No.: US 6,744,262 B2
(45) Date of Patent: Jun. 1, 2004

(54) METHOD, APPARATUS, AND ARTICLE OF MANUFACTURE FOR CHARACTERIZING A DEVICE AND PREDICTING ELECTRICAL BEHAVIOR OF THE DEVICE IN A CIRCUIT

(75) Inventor: Vahe' A. Adamian, Lexington, MA (US)

(73) Assignee: Agilent Technologies, Inc., Palo Alto, CA (US)

( * ) Notice: Subject to any disclaimer, the term of this patent is extended or adjusted under 35 U.S.C. 154(b) by 34 days.

(21) Appl. No.: 10/098,040

(22) Filed: Mar. 14, 2002

(65) Prior Publication Data

US 2003/0173975 A1 Sep. 18, 2003

(51) Int. Cl.$^7$ .............................................. G01R 27/32
(52) U.S. Cl. ....................... 324/638; 324/601; 324/612; 702/57; 703/2
(58) Field of Search ............................. 324/601, 638, 324/641–642, 612, 646; 702/57, 196, 85, 90; 703/2, 4, 14; 716/4, 16

(56) References Cited

U.S. PATENT DOCUMENTS

| | | | |
|---|---|---|---|
| 5,025,402 A | | 6/1991 | Winkelstein ................. 703/14 |
| 5,434,511 A | | 7/1995 | Adamian et al. |
| 5,537,046 A | * | 7/1996 | Adamian et al. ........... 324/601 |
| 5,548,221 A | | 8/1996 | Adamian et al. ........... 324/601 |
| 5,578,932 A | | 11/1996 | Adamian |
| 5,793,213 A | * | 8/1998 | Bockelman et al. ........ 324/601 |
| 6,106,563 A | | 8/2000 | Stengel et al. ................ 703/13 |
| 6,300,775 B1 | * | 10/2001 | Peach et al. ................. 324/601 |
| 6,539,344 B1 | * | 3/2003 | Stengel et al. ................. 703/2 |
| 2002/0053899 A1 | | 5/2002 | Adamian et al. ........ 324/76.19 |
| 2003/0135344 A1 | | 7/2003 | Martens ...................... 702/117 |
| 2003/0173978 A1 | | 9/2003 | Adamian et al. ........... 324/638 |
| 2003/0200039 A1 | | 10/2003 | Adamian et al. ............. 702/65 |

OTHER PUBLICATIONS

Agilent Technologies, Inc Application Note entitled "De–embedding and Embedding S•Parameter Networks Using a Vector Network Analyzer", Mar. 22, 2001.

Bockelman and Eisenstadt, "Combined Differential and Common Mode Scattering Parameters: Theory and Simulation", IEEE Transactions on Microwave Theory and Techniques, vol. 43, No. 7, Jul. 1995.

Bockelman, Eisenstadt, and Stengel, "Accuracy Estimation of Mixed•Mode Scattering Parameter Measurements", IEEE Transactions on Microwave Theory and Techniques, vol. 47, No. 1, Jan. 1999.

Bockelman and Eisenstadt, "Calibration and Verification of the Pure•Mode Vector Network Ananlyzer", IEEE Transactions on Microwave Theory and Techniques, vol. 46, No. 7, Jul. 1998.

Bockelman, Eisenstadt, and Stengel, "Pure•Mode Network Analyzer for On•Wafer Measurements of Mixed–Mode S•Parameters of Differential Circuits", IEEE Transactions on Microwave Theory and Techniques, vol. 45, No. 7, Jul. 1997.

* cited by examiner

Primary Examiner—Anjan K. Deb

(57) ABSTRACT

A method, apparatus and article of manufacture to aid in the characterization of a device establishes a device S-parameter matrix ($S_D$) to represent electrical behavior of the device, an adapter T-parameter matrix ($T_a$) to represent all possible electrical paths through circuits to all device ports of the device, and a cascaded S-parameter matrix ($S_c$) to represent the circuits cascaded with the device. Values for the adapter T-parameter matrix are obtained either through measurement or modeling. The device cascaded with the circuits is measured to obtain values for the cascaded S-parameter matrix, permitting use of a general solution for the device S-parameter matrix as a function of the adapter T-parameter matrix and the cascaded S-parameter matrix.

15 Claims, 15 Drawing Sheets

US 6,744,262 B2

METHOD, APPARATUS, AND ARTICLE OF MANUFACTURE FOR CHARACTERIZING A DEVICE AND PREDICTING ELECTRICAL BEHAVIOR OF THE DEVICE IN A CIRCUIT

BACKGROUND

A vector network analyzer (VNA) is conventionally used to measure scattering parameters by presenting a stimulus to a device under test (DUT) and measuring the DUT's response to the stimulus. The resulting scattering parameters mathematically define electrical behavior in terms of reflection and transmission coefficients of the measured DUT over a frequency range of interest. It is typically not possible to directly connect the DUT to the VNA to obtain a measurement of only the DUT. It is more typical that there are intermediate connectors, cables, transmission lines and other circuitry between the stimulus and measurement ports of the VNA and the DUT. For purposes of the present disclosure, the general term that is used for all of the intermediate connections between the VNA and the measured device is "an adapter". At low frequencies the electrical behavior of the adapter may not significantly affect the measurement of the DUT. At high frequencies, however, the response of the adapter as cascaded with the DUT for which a measurement is desired, can be as significant or more significant that the response attributable to the DUT itself. It is therefore imperative that the measurement process be able to account for and eliminate the effects of the adapter to obtain a measurement of the electrical behavior of the DUT in isolation. This process is called de-embedding the DUT from the adapter or characterizing the DUT.

Once the DUT is characterized, a circuit designer is able to use the mathematical representation of the electrical behavior of the DUT together with a modeled or measured circuit to predict the electrical behavior of the DUT in combination with the modeled or measured circuit. This practice is termed "embedding" and is especially valuable because circuit combinations may be designed and tested without expending the time, money, and effort to build and test a prototype. Obviating the practice of building prototypes that do not operate as desired reduces time to market because it increases the probability that a circuit that is eventually built will optimally perform for its intended purpose.

Agilent Technologies, Inc. application note 1364-1 entitled "De-embedding and Embedding S-Parameter Networks Using a Vector Network Analyzer" presents a process for de-embedding a measurement of a DUT from the interfering electrical effects of intermediate adapters and is hereby incorporated by reference. With specific reference to FIG. 1 of the drawings, there is shown a test set-up for a 2N-port DUT 100. A first adapter 102, also having 2N adapter ports is cascaded with the 2N-port DUT 100 as well as a 2N port second adapter 110. The cascaded combination of the first adapter 102, the DUT 100, and the second adapter 110 is connected to VNA 106. The VNA 106 has 2N test ports $116_1$ through $116_{2N}$ and comprises a stimulus 112, a test set 104, a reference channel receiver 94, and a plurality of test channel receivers $96_1$ through $96_{2n}$. The output of the stimulus 112 is connected to first signal separating device 92. The forward orientation of the first signal separating device 92 samples a small amount of output power from the stimulus 112 and feeds the sampled signal to the reference channel receiver 94 to provide a reference measurement. Most of the output power from the stimulus 112, however, is delivered to a pole of a single pole, multiple throw switch 98. The switch 98 selectively connects the stimulus signal to one of a plurality of switch output ports $114_1$ through $114_{2n}$. FIG. 1 shows an embodiment of the switch 98 having as many output ports 114 as there are adapter ports to measure in the cascaded combination of the first adapter 102, the DUT 100, and the second adapter 110. The test set 104 also comprises a plurality of single pole double throw switches $90_1$ through $90_{2n}$ connected to each switch output port 114. The single pole double throw switches $90_1$ through $90_{2n}$ permit a signal delivered by the stimulus 112 to be fed to any port of the cascaded combination while the remaining ports are terminated in one of a plurality of respective characteristic impedances $120_1$ through $120_{2n}$. Accordingly, a signal from the stimulus 112 may be fed to any test port 116 through an appropriate configuration of switch 98 and switches $90_1$ through $90_{2n}$. Concurrently, all remaining test ports 116 may be terminated to its characteristic impedance 120. FIG. 1 shows the signal from the stimulus 112 being fed to port 1 of the first adapter 102 while all remaining first and second adapter ports that are connected to test ports 116 are terminated with a characteristic impedance. Each test port 116 comprises a respective test channel signal-separating device $88_1$ through $88_{2n}$. A main arm of each test channel signal-separating device 88 is connected to a respective test port 116. As illustrated in FIG. 1, the first adapter ports 1 through n and the second adapter ports n+1 through 2n are each connected to one of the test ports 116. The sampling arm of each test channel signal-separating device 88 is connected to each one of a respective plurality of VNA test channel receivers $96_1$ through $96_{2n}$. The test channel receivers 96 measure the output power present at each test port 116. A reverse orientation of the signal separating devices 88 permits measurement of both reflected and transmitted signals from the adapter ports to which the VNA test channel is connected. As a signal from the stimulus 112 is swept across a desired frequency bandwidth, the ratio of power measured at the test channel receivers 96 relative to the power measured at the reference channel receiver 94 is obtained. As shown in the illustration of FIG. 1, it is desirable to have as many VNA test ports 116 as there are adapter ports to measure. As the number of ports increases, however, this luxury becomes economically prohibitive. Accordingly, it is conventional practice to share VNA test ports 116 at the expense of speed to make the same measurements.

FIG. 1 illustrates the DUT 100 having input device ports $108_1$ through $108_n$ and device ports $108_{n+1}$ and $108_{n+1}$ through $108_{2n}$ connected to ports n+1 through 2n of the first adapter 102 and ports 1 through n of the second adapter 110, respectively. The first and second adapters 102, 110 are cascaded with the DUT 100 on either side so that all device ports 108 are connected to the VNA test ports 116 through either the first or second adapters 102, 110. As one of ordinary skill in the art appreciates, the first and second adapters 102, 110 represent all of the connectors, cabling and circuitry required connecting the DUT 100 to the VNA 106. If the S-parameters for the first adapter 102 and the second adapter 110 are known either through measurement or modeling, one can measure the cascaded combination of the first and second adapters 102, 110 with the DUT 100. The S-parameters may then be converted to the corresponding scattering transfer parameters also termed transmission parameters or T-parameters. The matrix $T_X$ represents the T-parameters of the first adapter 102, the matrix $T_Y$ represents the T-parameters of the second adapter 110, and $T_c$ represents the T-parameters of the cascaded combination of first and second adapters 102, 110 and the DUT 100. The T-parameters of the DUT, represented by the matrix $T_D$, may be mathematically extracted from these measurements by using:

$$[T_c]=[T_X][T_D][T_Y]$$

Solving for $T_D$:

$$[T_D]=[T_X]^{-1}\cdot[T_c]\cdot[T_Y]^{-1}$$

The T-parameter matrix for the DUT, $T_D$, may then be converted into its corresponding S-parameter matrix, $S_D$.

It is known to use the same principles to de-embed and embed a DUT having more than four ports. U.S. Pat. No. 5,578,932 entitled "Method and Apparatus for Providing and Calibrating a Multi-port Network Analyzer" discloses a method and apparatus to perform measurements of an N-port DUT using a 2-port VNA. One of the limitations of the prior art embedding and de-embedding processes is that the DUT must be have an even number of ports Additionally, the first and second adapters that connect the DUT with the VNA must also have the same even port configuration as the DUT. The physical world, however, does not always cooperate with these restrictions. There are many devices that are used in electrical circuits that have an odd number of device ports. Specific examples of DUTs that present a measurement challenge as a result of an odd number of device ports are baluns, terminated directional couplers, power dividers, switches, digital devices and some filters. The prior art does not disclose how to properly represent these devices in matrices that may be manipulated as part of the conventional de-embedding and embedding process. Using the conventional approach, the matrix that represents the electrical behavior of the first adapter is a different size than the matrix that represents the electrical behavior of the second adapter. Accordingly, the process presented in the prior art cannot be performed on the matrices that result from the measurements made of the first and second adapters. Under the prior art, embedding and de-embedding of devices having an odd number of input or output device ports is simply not possible. There is a need, therefore, for a general process to permit embedding and de-embedding of devices with an odd number of input or output ports.

The characterization process as is conventionally known and briefly described above performs quite well for the case where all of the adapters, such as the adapter X and the adapter Y, are electrically isolated from each other. A specific example of measurements that present a challenge to the methods, apparatus', and models disclosed in the prior art are DUTs that are disposed on a semi-conductor wafer. In order to access on-wafer DUTs, it is necessary to make measurements through one or more adapter circuits comprising connectors and cabling to a wafer probing station, transmission lines to the probes, and through the probes themselves to all ports of the DUT. It is likely that there is leakage and electrical interaction between the adapter circuits to all ports of the DUT. As an example, adjacent probes may radiate and energy present on one probe may couple to an adjacent probe. The prior art representation of the first and second adapters 102, 110 relative to the DUT 100 assumes that the first adapter 102 is electrically isolated from the second adapter 110. This isolation assumption accurately reflects the conventional situation where one or more input connectors connect one port of the VNA to input ports of the DUT and one or more output connectors connect another port of the VNA to output ports of the DUT. This isolation assumption, however, does not properly apply to the physical reality of on-wafer measurements where there may be interaction or coupling between the adapters that connect the input and output ports of the DUT 100 to the VNA 106. The limitations of the prior model as applied to the reality of the on-wafer measurement create errors in the resulting DUT characterization. Use of an erroneous characterization to predict electrical behavior of the DUT 100 in combination with another circuit produces results that are less reliable than what would be produced using an accurate characterization. Reliable and accurate characterization reduces the disparity between predicted behavior and actual behavior saving time and money during the design process. There is a need, therefore, for a method, apparatus, and article of manufacture to characterize a DUT 100 that is embedded in surrounding circuitry more accurately than in the prior art.

Also in the prior art, a VNA measurement port is assigned to a specific port number on the DUT and is thereafter fixed by convention. The user must adapt the cabling and hook-ups to the appropriate DUT ports in order to obtain valid measurements for different port numbering. For simple DUTs, this is merely an inconvenience and requires that the user give thought to the most efficient connections to the DUT with the possible addition of cabling and matching connectors to effect the connections of the device ports to the proper VNA measurement ports. The additional cabling required presents the possibility of non-repeatable errors that are not fully compensated by the measurement process. It is desirable, therefore, to have a more flexible port assignment process when making VNA measurements. In the case of DUTs with higher numbers of device ports, the inconvenience presented increases geometrically with each increase in the number of device ports. In the case of DUTs that are on-wafer, this inconvenience becomes unworkable because the port assignment and probe access pad orientation from one DUT to an adjacent DUT may not be the same. The intermediate adapter comprising the cabling and probes, however, remains fixed. A possible solution to the challenge is to manually disconnect the cabling and reconnect to the proper VNA ports or place a complex switch in the adapter circuitry. Besides being either prohibitively cumbersome, time consuming or expensive, the change to the connections and bends in the cables introduces either measurement errors for which the compensation mechanism requires additional measurement and error correction or non-repeatable errors than cannot be ascertained and eliminated. There is a need, therefore, for a method, system, and apparatus that permits flexible assignment of measurement ports of the VNA to the device ports of the adapters and DUT.

The present invention endeavors to address these and other limitations and shortcomings of the prior art.

DETAILED DESCRIPTION

Figure 1:
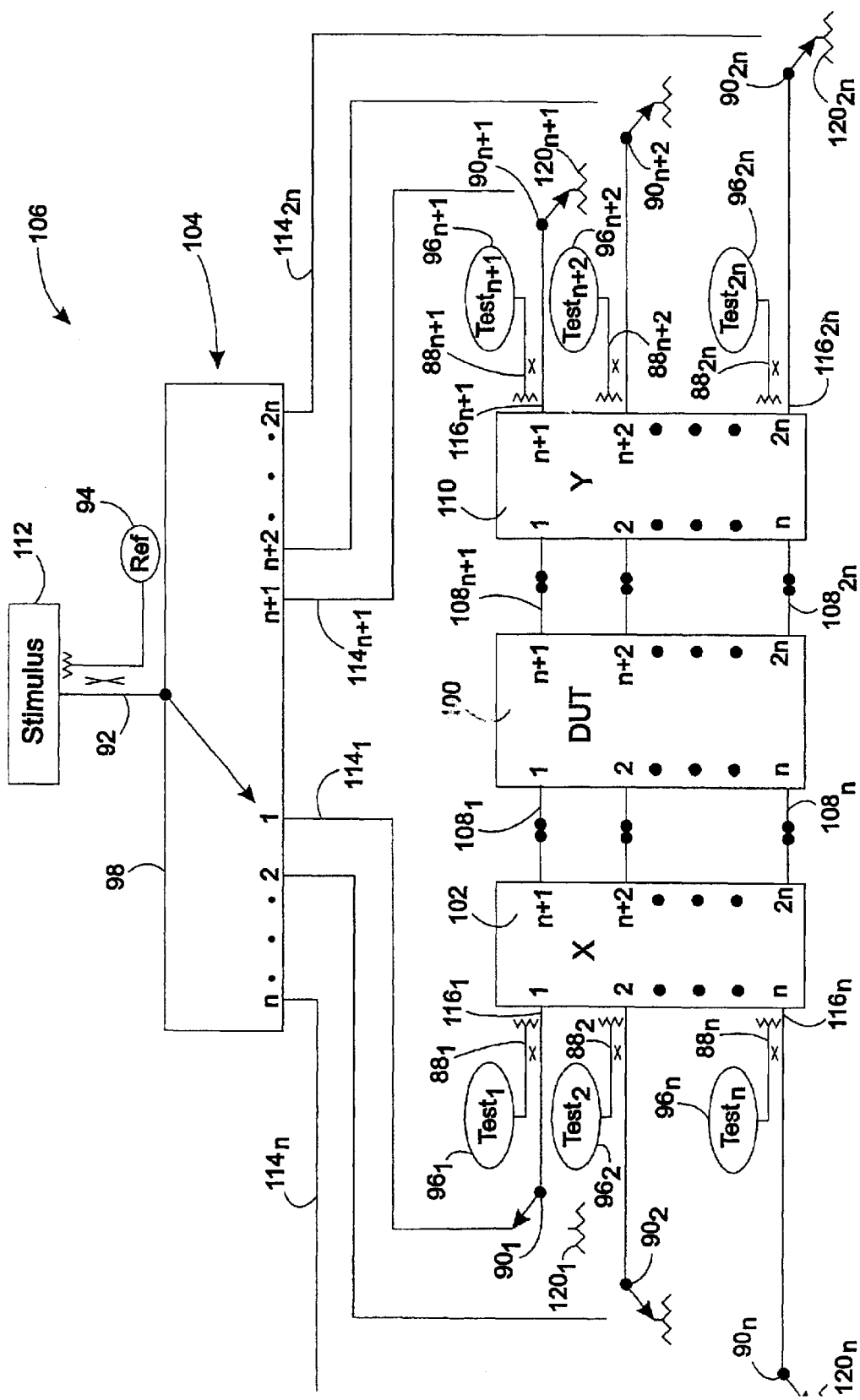
FIG. 1 illustrates a conventional measurement configuration including first and second isolated adapters connecting a multi-port DUT to ports of a VNA.

With specific reference to FIG. 1 of the drawings, there is shown a general representation of a multi-port DUT 100. The DUT 100 is shown with n device input ports, $108_1$ through $108_n$, where n represents any integer number. The device ports $108_1$ through $108_n$ are connected to a VNA 106 through a multi-port test set 104 and first adapter 102, which is denoted as adapter "X". The multi-port test set 104 multiplexes a number of device ports to a single stimulus port of the VNA 106 and terminates the remaining test 116 ports in characteristic impedances 120. The multi-port test set may be either external to the VNA 106 or may be incorporated as part of the VNA 106. Similarly, device output ports $108_{n+1}$ through $108_{2n}$ are connected to the VNA 106 through the multi-port test set 104 and second adapter 110, denoted as adapter "Y". In some cases, the VNA 106 is in communication with a computer (not shown). Many VNAs 106 include measurement as well as processing hardware. In many cases, the processing capability in the VNA 106 rivals or surpasses the processing capability of the computer with which it is communication. The teachings of the present invention call for both measurement and processing capabilities. For purposes of interpreting scope of the teachings, it is unimportant whether there is an external processor connected to the measurement device because the processing disclosed herein may be done on either the processor of the VNA or on a processor external of the VNA and on the basis of data taken from the VNA. This being the case, it is also possible to take measurements on a VNA, store the data in a computer readable media and complete the characterization process later on the same or on a different computing device at the user's discretion.

Figure 2:
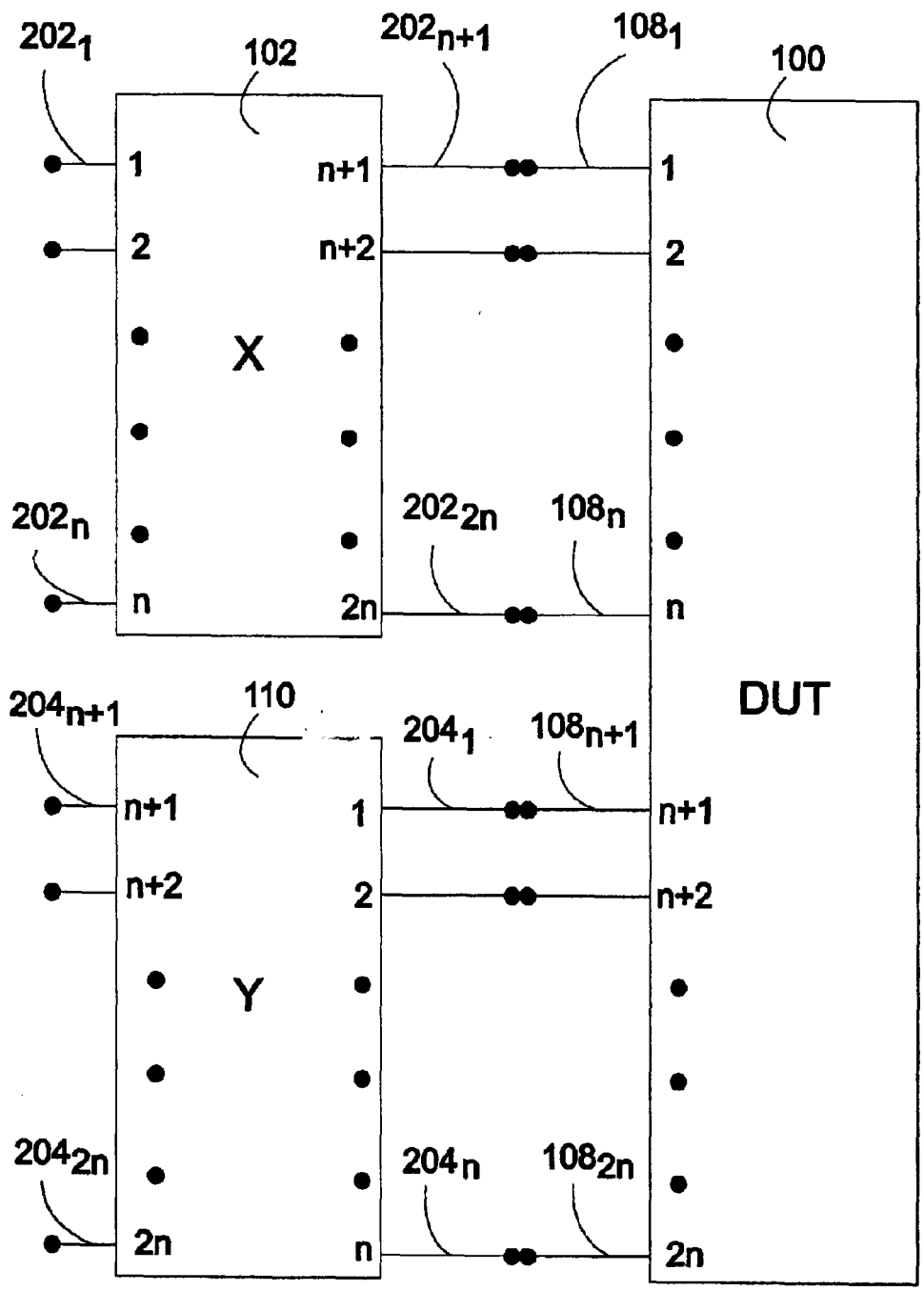
FIG. 2 illustrates a re-conceptualization according to the teachings of the present invention showing the interconnection of the multi-port DUT and the first and second adapters shown in FIG. 1.

With specific reference to FIG. 2 of the drawings, there is shown a reconceptualization of the conventional interconnection between the DUT 100, the first adapter 102, and the second adapter 110. In the reconceptualization shown in FIG. 2 of the drawings, the first adapter 102 has a plurality of first adapter input ports $202_1$ through $202_n$ and an equal plurality of first adapter output ports $202_{n+1}$ through $202_{2n}$. The first adapter output ports $202_{n+1}$ through $202_{2n}$ are connected to device ports $108_1$ through $108_n$ of the DUT 100. The second adapter 110 has a plurality of second adapter input ports $204_1$ through $204_n$ and an equal plurality of second adapter output ports $204_{n+1}$ through $204_{2n}$. The second adapter input ports $204_1$ through $204_n$ are connected to the remaining device ports $108_{n+1}$ through $108_{2n}$ of the DUT 100. As one of ordinary skill in the art appreciates, the connection of the first and second adapters 102, 110 to the DUT 100 is the same as that represented in FIG. 1 except that both adapters 102, 110 and all device ports $108_1$ through $108_{2n}$ are represented on only one side of the DUT 100.

Figure 3:
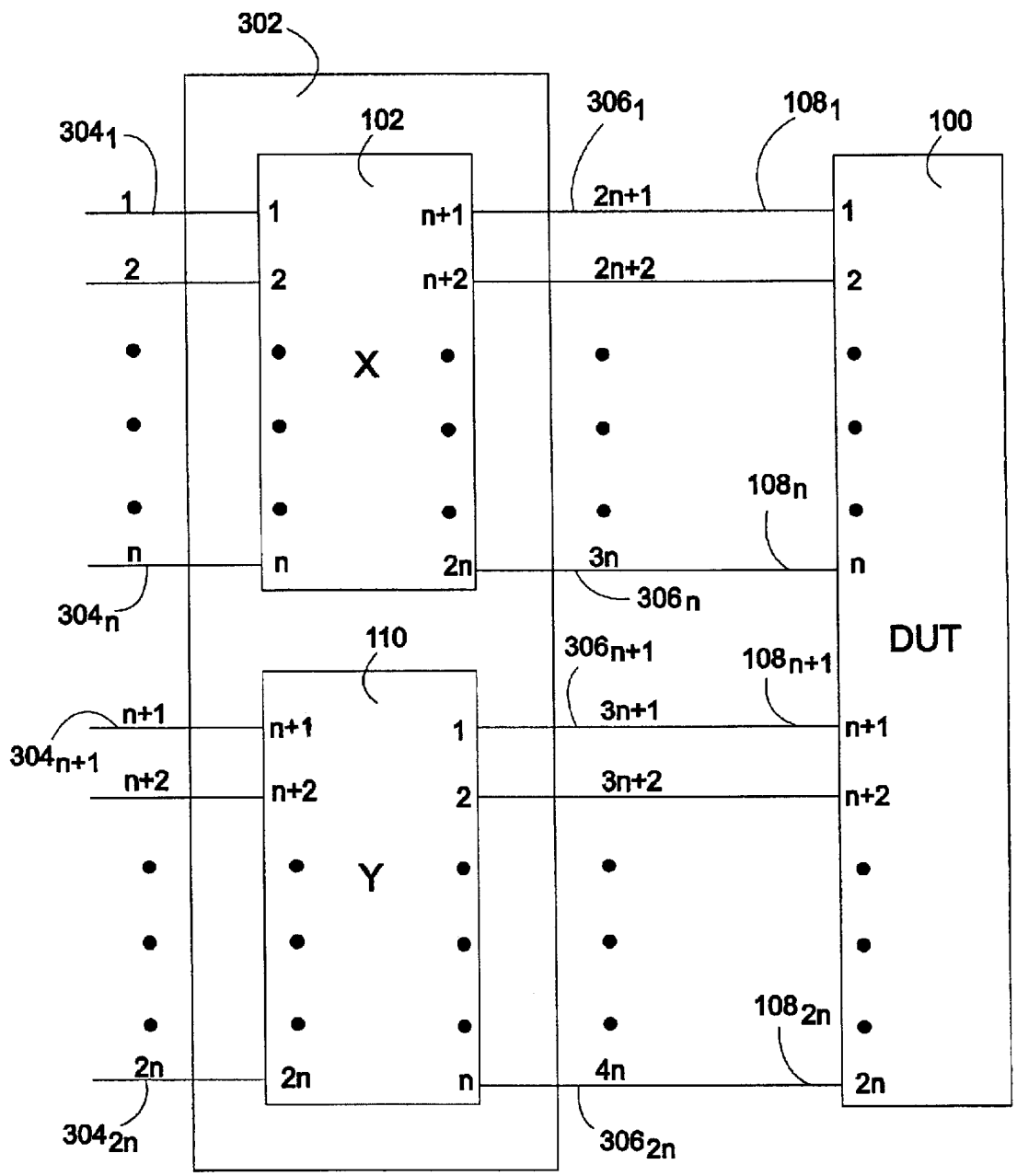
FIG. 3 illustrates the re-conceptualization of FIG. 2, showing a combined adapter and with the addition of new port numbers assigned to the combined adapter.

With specific reference to FIG. 3 of the drawings, there is shown a further representation of the interconnection between the first adapter 102, the second adapter 110, and the DUT 100. FIG. 3 further develops the representation shown in FIG. 2 of the drawings by presenting the first and second adapters 102, 110 as a single combined adapter 302. The combined adapter 302 has a plurality of input adapter ports $304_1$ through $304_{2n}$ and an equal plurality of output adapter ports $306_1$ through $306_{2n}$. The port numbers of the combined adapter 302 are different from the respective port numbers of the first and second adapters 102, 110 because to properly characterize the combined adapter 302 with S-parameters each port must have a unique identifier.

Figure 4:
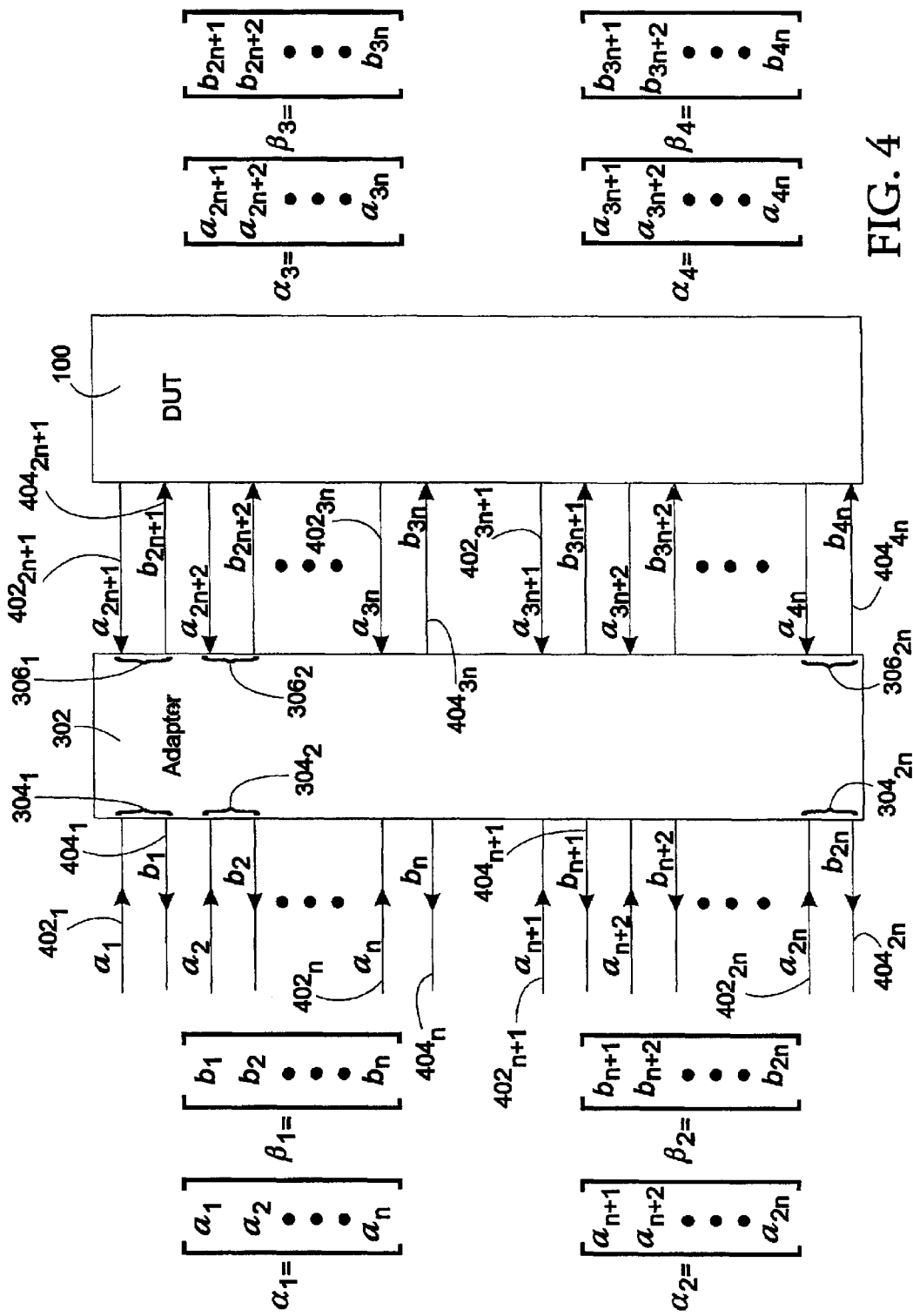
FIG. 4 illustrates transmission and reflection signals to and from all ports of the combined adapter and the DUT.
Figure 5:
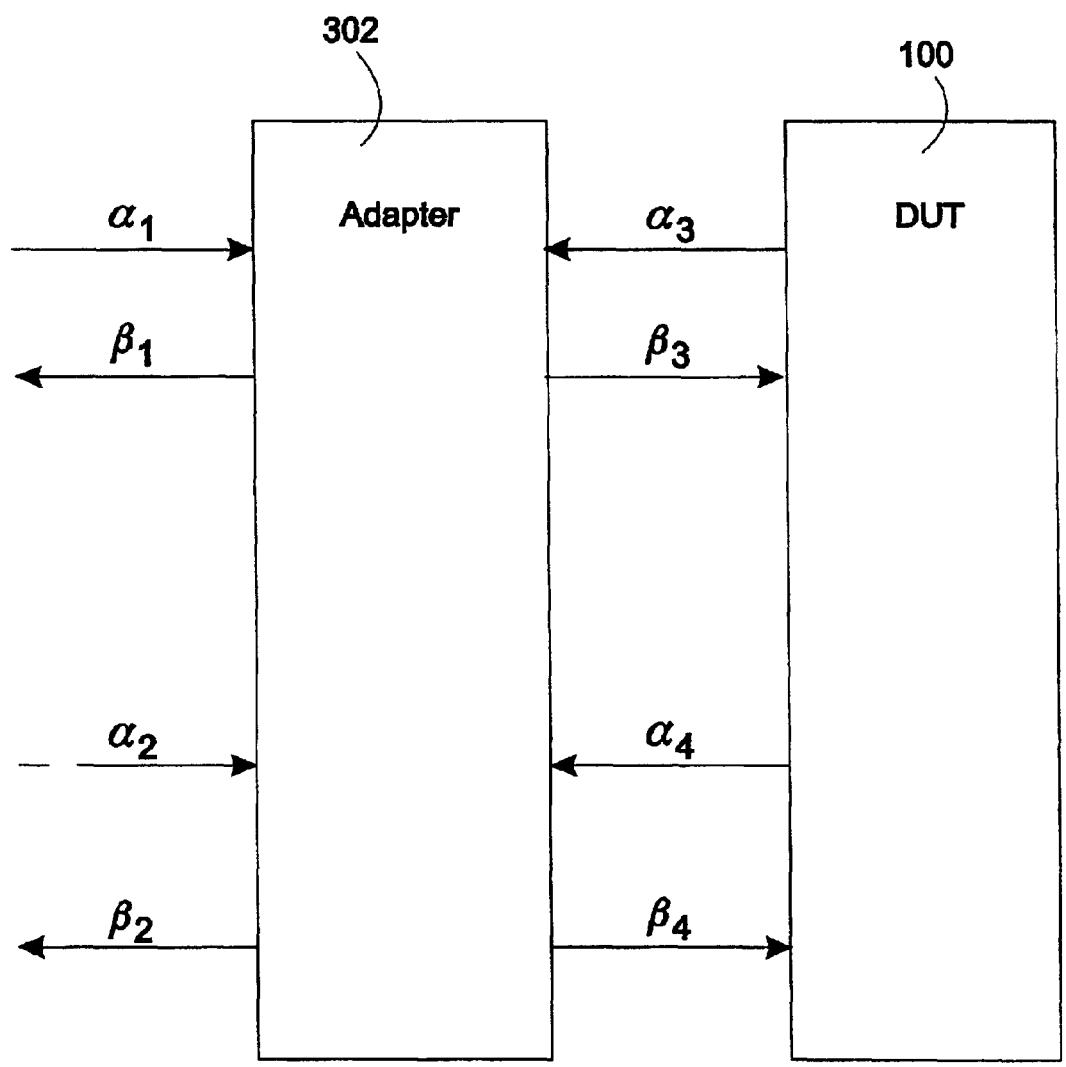
FIG. 5 illustrates the same signals shown in FIG. 4, but illustrates them as a clustered group for additional clarity.

With specific reference to FIG. 4 of the drawings, there is shown a representation of incident waves $402_1$ through $402_{4n}$ and reflected waves $404_1$ through $404_{4n}$. Each of the ports $304_1$ through $304_{2n}$ and $306_1$ through $306_{2n}$ of the adapter 302 as shown in FIG. 3 of the drawings have a corresponding incident and reflected electrical signal which is shown in FIG. 4 of the drawings. In FIG. 4, matrices $\alpha_1$ and $\alpha_2$ represent the waves incident to the combined adapter input ports $304_1$ through $304_n$ and $304_{n+1}$ through $304_{2n}$, respectively. Matrices $\beta_1$ and $\beta_2$ represent the waves reflected from the combined adapter input ports $304_1$ through $304_n$ and $304_{n+1}$ and $304_{2n}$, respectively. Matrices $\alpha_3$ and $\alpha_4$ represent the waves incident to the combined adapter output ports $306_1$ through $306_n$ and $306_{n+1}$ and $306_{2n}$, respectively, and matrices $\beta_3$ and $\beta_4$ represent the waves reflected from the combined adapter output ports $306_1$ through $306_n$ and $306_{n+1}$ and $306_{2n}$, respectively. As one of ordinary skill in the art appreciates, for the interconnection points between the adapter 302 and the DUT 100, the waves that are incident to the combined adapter 302 are reflected relative to the DUT 100. Similarly, the waves that are reflected from the combined adapter 302 are incident relative to the DUT 100. FIG. 5 of the drawings is an alternate representation of FIG. 4. From FIG. 5 of the drawings, there emerges a relationship between the combined adapter 302 and the DUT 100, which may be represented by the equation:

$$\begin{bmatrix} \beta_1 \\ \beta_2 \\ \beta_3 \\ \beta_4 \end{bmatrix} = S_a \begin{bmatrix} \alpha_1 \\ \alpha_2 \\ \alpha_3 \\ \alpha_4 \end{bmatrix}$$

where $S_a$ represents the S-parameter matrix for the combined adapter 302. This equation may be rewritten in terms of T-parameters as:

$$\begin{bmatrix} \beta_1 \\ \beta_2 \\ \alpha_1 \\ \alpha_2 \end{bmatrix} = T_a \begin{bmatrix} \alpha_3 \\ \alpha_4 \\ \beta_3 \\ \beta_4 \end{bmatrix}$$

where $T_a$ represents the T-parameter matrix for the combined adapter 302. The combined adapter T-parameter matrix, $T_a$, may be partitioned into constituent quadrants represented as:

$$T_a = \begin{bmatrix} T_{a11} & T_{a12} \\ T_{a21} & T_{a22} \end{bmatrix}$$

where $T_{a11}$ represents the upper left quadrant, $T_{a12}$ represents the upper right quadrant, $T_{a21}$ represents the lower left quadrant, and $T_{a22}$ represents the lower right quadrant. Substituting the partitioned matrix, $T_a$, into the equation representing the relationship between the incident and reflected waves relative to the combined adapter 302 results in the following relationships:

$$\begin{bmatrix} \beta_1 \\ \beta_2 \end{bmatrix} = T_{a11} \begin{bmatrix} \alpha_3 \\ \alpha_4 \end{bmatrix} + T_{a12} \begin{bmatrix} \beta_3 \\ \beta_4 \end{bmatrix}$$

and $$\begin{bmatrix} \alpha_1 \\ \alpha_2 \end{bmatrix} = T_{a21} \begin{bmatrix} \alpha_3 \\ \alpha_4 \end{bmatrix} + T_{a22} \begin{bmatrix} \beta_3 \\ \beta_4 \end{bmatrix}$$

With specific reference to FIG. 5 of the drawings, using the fact that certain ones of the waves that are incident to the combined adapter 302 are reflected from the DUT 100 and certain ones of the waves that are reflected from the combined adapter 302 are incident to the DUT 100, there are additional relationships between the combined adapter 302 and the DUT 100 that may be represented by the equations:

$$\begin{bmatrix} \alpha_3 \\ \alpha_4 \end{bmatrix} = S_D \begin{bmatrix} \beta_3 \\ \beta_4 \end{bmatrix} \quad \text{and} \quad \begin{bmatrix} \beta_1 \\ \beta_2 \end{bmatrix} = S_C \begin{bmatrix} \alpha_1 \\ \alpha_2 \end{bmatrix}$$

where $S_D$ represents the S-parameters of the DUT 100 and $S_C$ represents the S-parameters of the cascaded combination of the DUT 100 and the combined adapter 302. Substituting the equations for $\alpha$ and $\beta$ as a function of the T-parameters and solving for $S_D$ results in a general equation for use in characterizing or de-embedding the DUT 100 from the combined adapter 302 with which it is cascaded. The general de-embedding equation is:

$$S_D = (T_{a11} - S_c T_{a21})^{-1}(S_c T_{a22} - T_{a12})$$

Similarly, substituting the equations for $\alpha$ and $\beta$ as a function of the T-parameters and solving for $S_c$ results in a general equation for use in embedding or predicting electrical behavior of a device cascaded with an adapter. The general embedding equation is:

$$S_c = (T_{a11} S_D + T_{a12}) \cdot (T_{a21} S_D + T_{a22})^{-1}$$

The combined adapter matrix, $S_a$ or $T_a$, provides a term for all interactions between any one port of the combined adapter 302 and any other port of the combined adapter 302. Use of the general equations, therefore, provides tools for a complete characterization of a combined adapter 302 and its interactions with the DUT 100. When there are no interactions between two ports, the disclosed method permits a mathematical representation of this condition as well. The provisions of the disclosed method, therefore, permit the combined adapter matrix to more closely accommodate the physical realities of a larger number of measurement scenarios than was available under the prior art. This renders the resulting solutions more accurate and, consequently, more useful. For example, the disclosed method accommodates the case of four isolated two port adapters cascaded with the four port DUT 100 as easily as it accommodates two 2-port adapters and one four port adapter cascaded with the four port DUT 100 or as easily as it accommodates an eight port adapter with electrical interactions between all ports cascaded with the four port DUT 100.

Depending upon the DUT and adapter configurations, values for the adapter T-parameter matrix may be obtained either through a measurement of the S-parameters of the combined adapter 302 and conversion to the corresponding T-parameters or a direct measurement of the T-parameters. Values may also be obtained through a measurement of the T-parameters or S-parameters of constituent first, second, etc. adapters. The T-parameter matrix may also be obtained through a calculation from a model of the adapter, or a combination of both calculation of one constituent adapter and a measurement of another. In a software implemented system, the S-parameters or T-parameters of constituent or and combined adapters may be stored as data files and then called for use when characterizing a DUT or predicting electrical behavior of a DUT embedded in a circuit.

Figure 6:
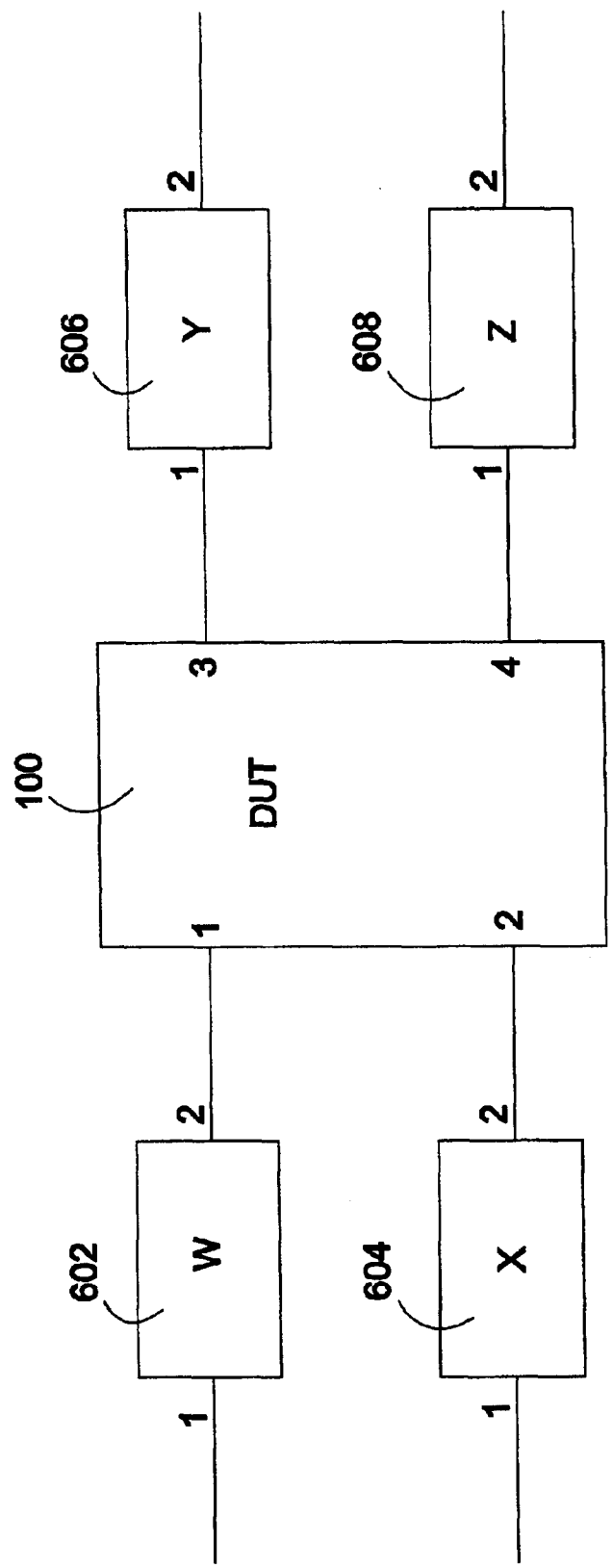
FIG. 6 illustrates a four port DUT with each port of the DUT connected to four two-port adapters that are isolated from each other.
Figure 7:
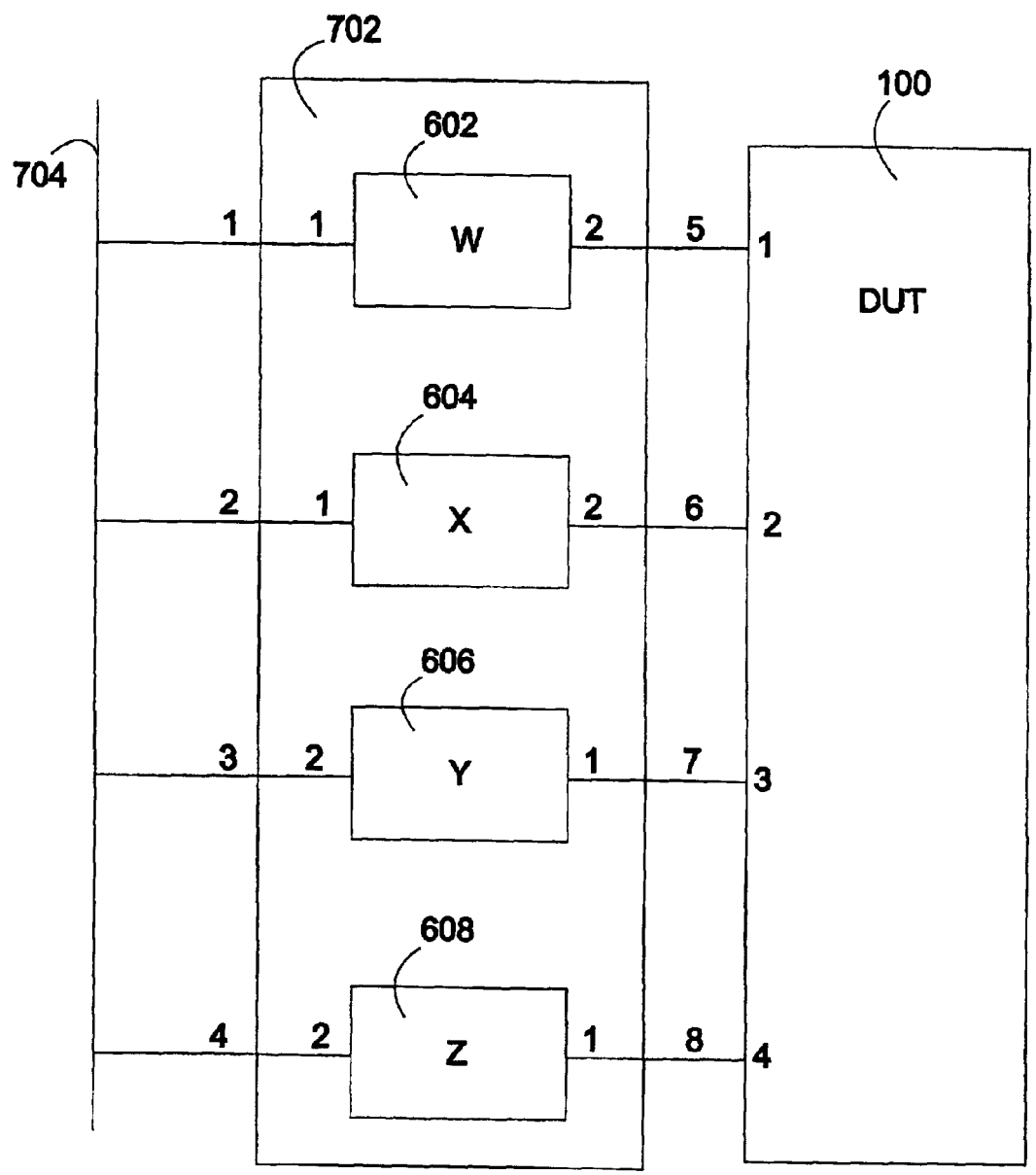
FIG. 7 illustrates a reconceptualization of the interconnection of FIG. 6 as the interconnection of the DUT with a single eight port adapter that comprises the combination of the four two port adapters.

As an illustrative example of a method for characterizing according to the teachings of the present invention and with specific reference to FIG. 6 of the drawings, there is shown a representation of a four port DUT 100 and four 2-port adapters 602, 604, 606, and 608, labeled W, X, Y, and Z. In the illustration, two of the four 2-port adapters are input adapters; here 602, 604 and the remaining two adapters are output adapters, here 606 and 608. As one of ordinary skill in the art will appreciate, the terms input and output adapters is a naming convention used for clarity only and does not have any impact upon the measurement or the methods disclosed herein. The four 2-port adapters 602 through 608 represent the circuitry that is disposed intermediate the VNA 106 (not shown in FIG. 6) and the DUT 100. Re-conceptualizing the interconnection shown in FIG. 6 of the drawings and with specific reference to FIG. 7 of the drawings, the combination of the four 2-port adapters 602–608 is represented as one 8-port combined adapter 702 disposed between a measurement plane 704 and the DUT 100. In order to establish the appropriate combined adapter T-parameter matrix, $T_a$, the ports of the combined adapter 702 are each renumbered with a unique identifier, in this case as ports 1 through 8. Assuming that the S-parameter matrices of the four 2-port adapters 602 through 608 are known, it is possible to build the combined adapter S-parameter matrix, $S_a$, for the combined adapter 702 and then convert it to the T-parameter matrix, $T_a$. The converted T-parameters are then used in the general characterization equation to extract the S-parameters of the DUT 100.

A conventional 2×2 element matrix represents the S-parameters of each of the 2-port adapters 602 through 608. The elements from the four representative matrices of the input and output adapters 602 through 608 are used to generate an 8×8 representative adapter S-parameter matrix, $S_a$. The adapter matrix, $S_a$, mathematically represents the reflection and transmission behavior of the adapter 702. If the letters W and X represent the two input adapters 602 and 604, respectively, and the letters Y and Z represent the two output adapters 606 and 608, respectively, then the four representative matrices may be expressed as:

$$\begin{bmatrix} S_{W11} & S_{W12} \\ S_{W21} & S_{W22} \end{bmatrix} \begin{bmatrix} S_{X11} & S_{X12} \\ S_{X21} & S_{X22} \end{bmatrix} \begin{bmatrix} S_{Y11} & S_{Y12} \\ S_{Y21} & S_{Y22} \end{bmatrix} \begin{bmatrix} S_{Z11} & S_{Z12} \\ S_{Z21} & S_{Z22} \end{bmatrix}$$

where the alphabetical subscript indicates the adapter. As one of ordinary skill in the art appreciates, each S-parameter represents the relationship between the stimulus and measured response between two ports. Each port represented by the numeric indices for each S-parameter and the position of an S-parameter within the matrix carries with it information as to its electrical behavior at a specific port when a stimulus is presented at another specific port. According to convention, the second index represents the port receiving a stimulus and the first index represents the port from which a response to the stimulus is measured. Because the combined adapter 702 represents the combination of the individual input and output adapters 602 through 608, all information necessary to create a single 8×8 representative S-parameter matrix may be found within the elements of the four individual matrices, $S_W$, $S_X$, $S_Y$ and $S_Z$.

To build the combined adapter S-parameter matrix, $S_a$, each reflection and transmission coefficient represented in the constituent matrices, $S_W$ through $S_Z$, is re-mapped according to the renumbering of the combined adapter 702. For example, port 2 of adapter Y 606 is re-mapped to port 3 of the combined adapter 702. In the illustrated example of FIG. 7, the S-parameters of adapters 602 and 604 are used to define the S-parameters for ports 1 and 5, and ports 2 and 6, respectively, of the combined adapter 702. Similarly, the S-parameters of adapters 606 and 608 are used to define the S-parameters for ports 3 and 7, and ports 4 and 8, respectively. It is important to note that the S-parameters defined for the adapters 606 and 608 are visually reversed in direction when compared to the adapters 602 and 604. This fact makes it important to consider the incident and reflection directions for each adapter when deciding which S-parameter to use to populate specific elements of the s-parameter matrix for the combined adapter 702. For example, the S-parameter element that represents the reflected signal at port 7 of the combined adapter 702 in response to a stimulus presented at port 7 of the combined adapter 702 is taken from $S_{Y11}$ and placed in the $S_{a77}$ position of the combined adapter S-parameter matrix. Accordingly, the combined matrix, $S_a$, that represents the combined adapter 702 becomes:

$$\begin{bmatrix} S_{W11} & 0 & 0 & 0 & S_{W12} & 0 & 0 & 0 \\ 0 & S_{X11} & 0 & 0 & 0 & S_{X12} & 0 & 0 \\ 0 & 0 & S_{Y22} & 0 & 0 & 0 & S_{Y21} & 0 \\ 0 & 0 & 0 & S_{Z22} & 0 & 0 & 0 & S_{Z21} \\ S_{W21} & 0 & 0 & 0 & S_{W22} & 0 & 0 & 0 \\ 0 & S_{X21} & 0 & 0 & 0 & S_{X22} & 0 & 0 \\ 0 & 0 & S_{Y12} & 0 & 0 & 0 & S_{Y11} & 0 \\ 0 & 0 & 0 & S_{Z12} & 0 & 0 & 0 & S_{Z11} \end{bmatrix}$$

The matrix elements in the combined adapter S-parameter matrix, $S_a$ that have a zero value indicate that there is isolation between each one of the adapters 602 through 608 from which the combined adapter 702 is devised. In the absence of isolation between some of the adapter ports, all of the S-parameter values in the combined adapter matrix, $S_a$, would have a non-zero value. Accordingly, this general solution provides a vehicle by which additional electrical paths within the adapter may be characterized without compromising the general applicability of the solution to simpler structures.

The combined adapter S-parameter matrix, $S_a$, may be represented as:

$$\begin{bmatrix} S_{a11} & S_{a12} \\ S_{a21} & S_{a22} \end{bmatrix}$$

and is partitioned into four equal matrices where:

$$S_{a11} = \begin{bmatrix} S_{W11} & 0 & 0 & 0 \\ 0 & S_{X11} & 0 & 0 \\ 0 & 0 & S_{Y22} & 0 \\ 0 & 0 & 0 & S_{Z22} \end{bmatrix}$$

$$S_{a12} = \begin{bmatrix} S_{W12} & 0 & 0 & 0 \\ 0 & S_{X12} & 0 & 0 \\ 0 & 0 & S_{Y21} & 0 \\ 0 & 0 & 0 & S_{Z21} \end{bmatrix}$$

$$S_{a21} = \begin{bmatrix} S_{W21} & 0 & 0 & 0 \\ 0 & S_{X21} & 0 & 0 \\ 0 & 0 & S_{Y12} & 0 \\ 0 & 0 & 0 & S_{Z12} \end{bmatrix}$$

$$S_{a22} = \begin{bmatrix} S_{W22} & 0 & 0 & 0 \\ 0 & S_{X22} & 0 & 0 \\ 0 & 0 & S_{Y11} & 0 \\ 0 & 0 & 0 & S_{Z11} \end{bmatrix}$$

Each partitioned S-parameter matrix may be represented as a T-parameter matrix using the following relationships:

$$T_{a11} = S_{a12} - S_{a11} S_{a21}^{-1} S_{a22}$$

$$T_{a12} = S_{a11} S_{a21}^{-1}$$

$$T_{a21} = -S_{a21}^{-1} S_{a22}$$

$$T_{a22} = S_{a21}^{-1}$$

$S_c$ is a 4×4 S-parameter matrix that represents the cascaded combination of the combined adapter 702 and the DUT 100. $S_c$ may be measured and is therefore a known value. Referring back to the general characterization equation disclosed herein:

$$S_D = (T_{a11} - S_c T_{a21})^{-1} (S_c T_{a22} - T_{a12})$$

in which the S-parameter matrix for the cascaded combination of the adapter 702 and the DUT 100, $S_c$, is presented as a function of the T-parameters of the adapter 702, $T_a$, and the S-parameters of the DUT 100, $S_D$. From this general equation, therefore, it is possible to mathematically solve for the S-parameters of the DUT 100, $S_D$. Specifically, because the adapter S-parameter matrix, $S_a$, is known, and may be converted into the corresponding T-parameters, the adapter T-parameters, $T_a$, are also known. Additionally, the S-parameters of the cascaded combination of the combined adapter 702 and the DUT 100 may be measured and is, therefore, also known. The only unknown that remains is the S-parameter matrix of the DUT 100, $S_D$, which may be solved for using the general equation above. The electrical behavior of the DUT 100, therefore, may be fully characterized separately from the combined adapter 702 with which it was measured.

Figure 8:
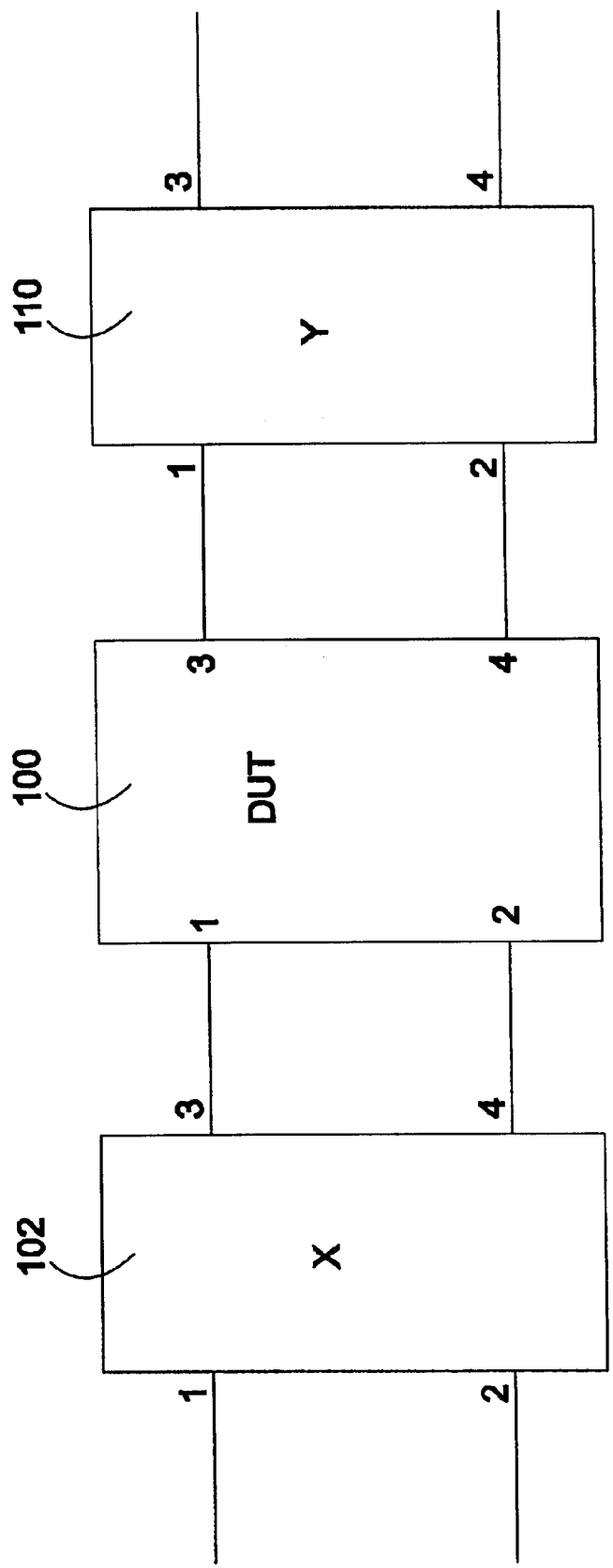
FIG. 8 illustrates a four port DUT with two ports of the DUT connected to a first four-port adapter and a remaining two ports of the DUT connection to a second four-port adapter.
Figure 9:
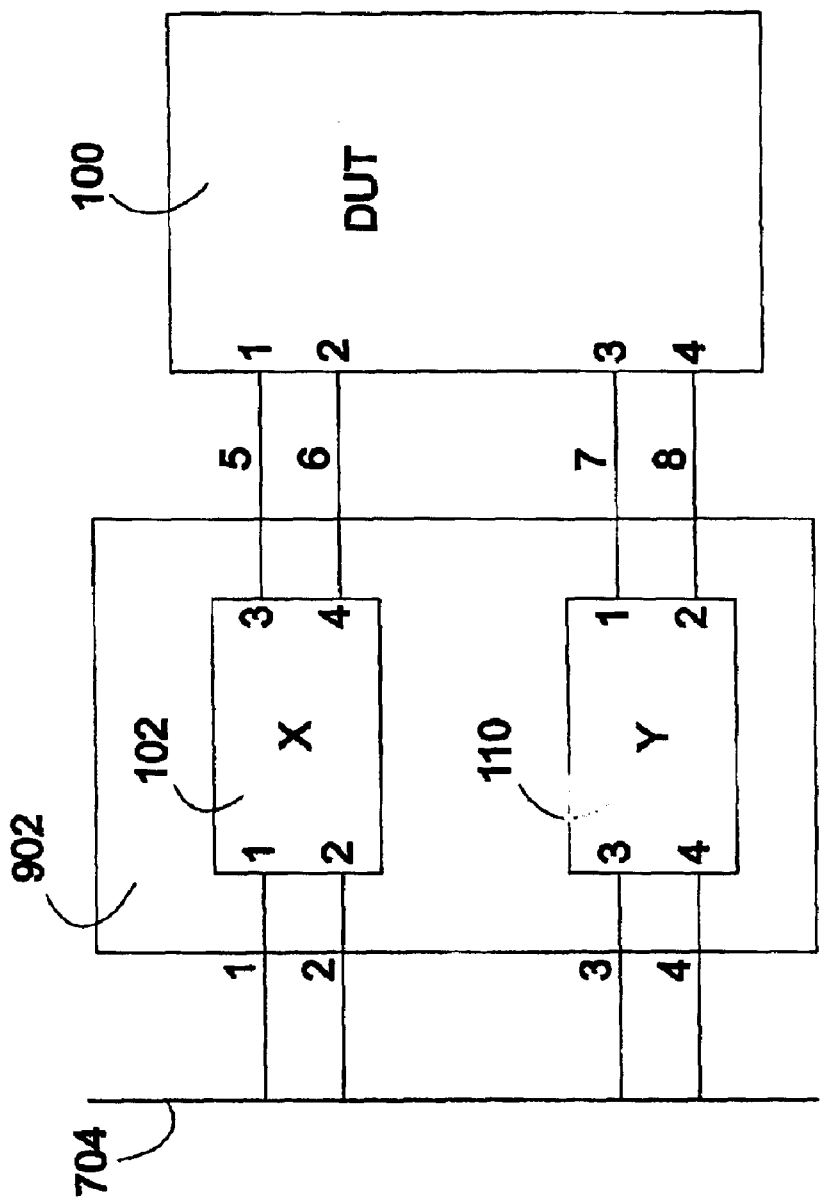
FIG. 9 illustrates a reconceptualization of the interconnection of FIG. 8 according to the teachings of the present invention as the interconnection of the four port DUT with a single eight port adapter that comprises the combination of the first and second four port adapters.

With specific reference to FIG. 8 of the drawings, there is shown a conventional representation of the DUT 100 cascaded with the first and second adapters 102, 110. FIG. 8 is similar to that shown in FIG. 1 where there are two adapters flanking a DUT, all with the same port configuration. In FIG. 9 of the drawings and for purposes of contrast, there is shown the corresponding re-conceptualized interconnection of the first and second adapters 102, 110 into the single combined adapter 702 with re-numbered adapter ports. FIGS. 8 and 9 of the drawings show only what has already been disclosed herein, except that this example shows a 4-port DUT 100, and two 4-port adapters 102, 110.

The visual reversal of one or more of the adapters adds a visual complexity that may make it difficult to assign the proper S-parameter values from the individual adapter matrices to the appropriate elements in the combined adapter S-parameter matrix, $S_a$. Without an aid, one must keep track of the appropriate incident and reflected waves relative to the calibration direction of the combined adapter 702 to build the appropriate combined adapter matrix. An implementation of the build process of the combined adapter matrix, $S_a$, can benefit from an intermediate step. This intermediate step is also helpful, but not necessary, to a software implementation of the general solution. The intermediate step re-assigns port numbers of the visually reversed adapter(s), here adapter 110, and makes a further correction to the s-parameter matrix for adapter 110, to accommodate the port number re-assignment. Specifically, port 1 is switched with port 3 and port 2 is switched with port 4. The port numbering of the first adapter 102 does not change and the port numbering of the combined adapter 702 does not change. The intermediate step accommodates the port number re-assignment of the second adapter 110 by interchanging port 1 with port 3. It is possible to easily implement this change in the second adapter S-parameter matrix, $S_Y$, by causing index 1 to become 3, index 3 to become 1 while index 2 becomes 4 and index 4 becomes 2. The change in the port designation index implies that the S-parameter value in the original position in the S-parameter matrix moves to the position in the matrix reflected by the new port numbering. This intermediate step results in a new S-parameter matrix for the second adapter 110 that accurately reflects the reflection and transmission behavior of the adapter element under the new port numbering convention. The intermediate step results in the following transposition:

$$\begin{bmatrix} S_{Y11} & S_{Y12} & S_{Y13} & S_{Y14} \\ S_{Y21} & S_{Y22} & S_{Y23} & S_{Y24} \\ S_{Y31} & S_{Y32} & S_{Y33} & S_{Y34} \\ S_{Y41} & S_{Y42} & S_{Y43} & S_{Y44} \end{bmatrix} \rightarrow \begin{bmatrix} S_{Y33} & S_{Y34} & S_{Y31} & S_{Y32} \\ S_{Y43} & S_{Y44} & S_{Y41} & S_{Y42} \\ S_{Y13} & S_{Y14} & S_{Y11} & S_{Y12} \\ S_{Y23} & S_{Y24} & S_{Y21} & S_{Y22} \end{bmatrix}$$

The s-parameter positioning of the first adapters 102 remains intact because its interconnection with the DUT 100 has not changed. The first and second adapter S-parameter matrices, therefore, are:

$$\begin{bmatrix} S_{X11} & S_{X12} & S_{X13} & S_{X14} \\ S_{X21} & S_{X22} & S_{X23} & S_{X24} \\ S_{X31} & S_{X32} & S_{X33} & S_{X34} \\ S_{X41} & S_{X42} & S_{X43} & S_{X44} \end{bmatrix} \text{ and } \begin{bmatrix} S_{Y33} & S_{Y34} & S_{Y31} & S_{Y32} \\ S_{Y43} & S_{Y44} & S_{Y41} & S_{Y42} \\ S_{Y13} & S_{Y14} & S_{Y11} & S_{Y12} \\ S_{Y23} & S_{Y24} & S_{Y21} & S_{Y22} \end{bmatrix}$$

The combined adapter matrix for FIG. 9 of the drawings is then given by:

$$\begin{bmatrix} S_{X11} & S_{X12} & 0 & 0 & S_{X13} & S_{X14} & 0 & 0 \\ S_{X21} & S_{X22} & 0 & 0 & S_{X23} & S_{X24} & 0 & 0 \\ 0 & 0 & S_{Y33} & S_{Y34} & 0 & 0 & S_{Y31} & S_{Y32} \\ 0 & 0 & S_{Y43} & S_{Y44} & 0 & 0 & S_{Y41} & S_{Y42} \\ S_{X31} & S_{X32} & 0 & 0 & S_{X33} & S_{X34} & 0 & 0 \\ S_{X41} & S_{X42} & 0 & 0 & S_{X43} & S_{X44} & 0 & 0 \\ 0 & 0 & S_{Y13} & S_{Y14} & 0 & 0 & S_{Y11} & S_{Y12} \\ 0 & 0 & S_{Y23} & S_{Y24} & 0 & 0 & S_{Y21} & S_{Y22} \end{bmatrix}$$

As in the previous example, the zero values for certain matrix elements that represent the combined adapter 702 indicate that there is no coupling between those ports. Also, as previously disclosed, the adapter S-parameter matrix, $S_a$, is then partitioned into four equally sized matrices and converted into the corresponding T-parameter matrices. The T-parameter matrices are then used to solve for the S-parameters of the DUT 100, $S_D$, using the general characterization equation:

$$S_D = (T_{a11} - S_c T_{a21})^{-1}(S_c T_{a22} - T_{a12})$$

In some cases, it is desirable for a user to re-define the port numbering of the DUT 100, the combined adapter 702, or both. With specific reference to FIGS. 10 and 11 of the drawings, there is shown the same physical representation as shown in FIGS. 8 and 9, except that the numbers applied to the ports of the DUT 100 and the first and second adapters 102, 110 are different. It is only the numbering convention that has changed. A practical significance of this change is that by allowing for a different numbering convention within the context of a general solution, one who is making characterization measurements may make practical decisions about how to interconnect the combined adapter 702 and the DUT 100 and then account for the interconnection in software. This is in keeping with the desirable objective of providing a solution that is able to closely model electrical reality rather than the undesirable situation where electrical reality is fit to the available model. For example, in the case of on-wafer testing, a single physical interconnection to an adapter results in one type of port numbering. As a wafer-stepper advances to a next location, it is possible that the access to the DUT 100 has a different positioning. Rather than force the user to re-connect the VNA 106 and multi-port test set 104 to the probe station, the method disclosed herein permits the change to be accommodated algorithmically. An algorithmic change is faster, does not present unrepeatable errors, and is more efficient than available under the prior art. Because the numbering convention is changed, however, the matrix positions of the adapter S-parameter matrix also change.

Figure 10:
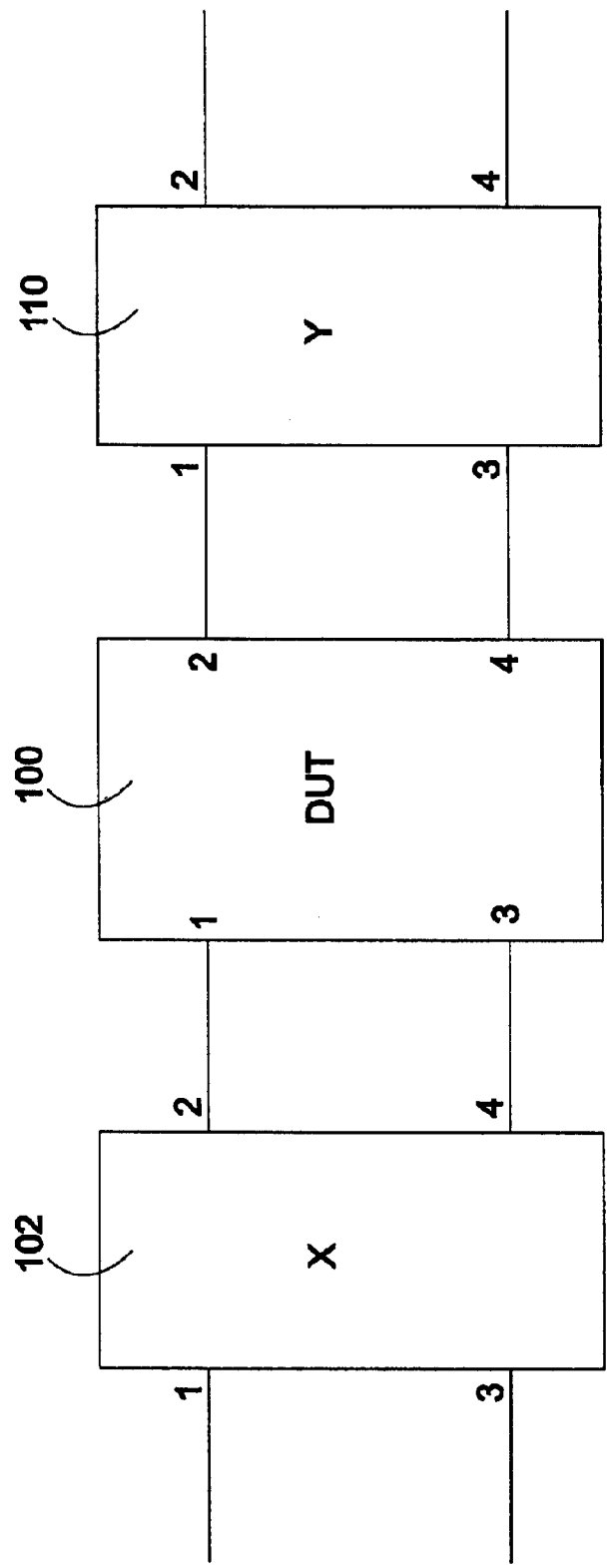
FIG. 10 illustrates an interconnection of a four port DUT with two four-port adapters similar to FIG. 8, except that two ports of both adapters and the DUT have different port numbering.
Figure 11:
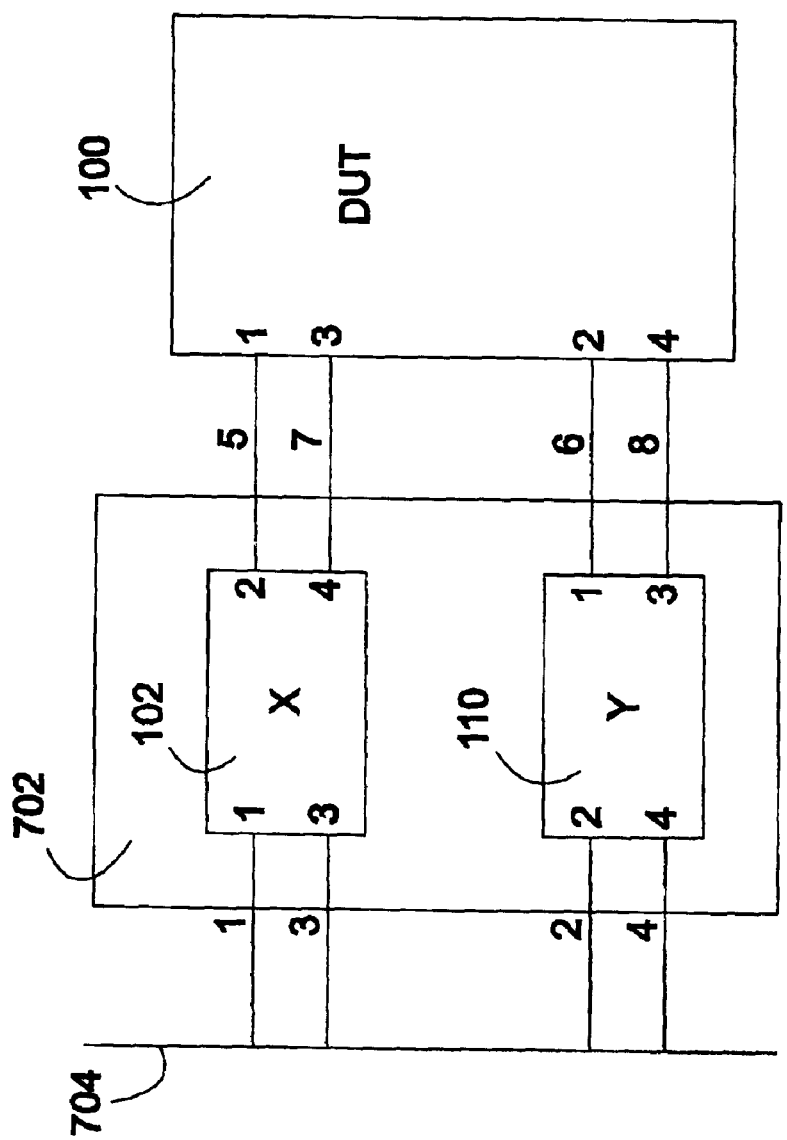
FIG. 11 illustrates a reconceptualization according to the teachings of the present invention of the interconnection of FIG. 11 retaining the alternate DUT port numbering shown in FIG. 11.

An illustrative example showing the process by which the ports of the adapter may be mathematically re-assigned and also using the intermediate step disclosed herein makes specific reference to FIGS. 10 and 11 of the drawings. As one of ordinary skill in the art can appreciate, the difference in port numbering between FIGS. 8 and 10 of the drawings is that ports numbered as 2 and 3 on both the first and second adapters 102, 110 as well as the DUT 100 are reversed. Accordingly, the interconnection of FIG. 11 is different that the interconnection of FIG. 9 in that port 2 of the first adapter 102 is connected to port 1 of the DUT 100, port 4 of the first adapter 102 is connected to port 3 of the DUT, port 1 of the second adapter 110 is connected to port 2 of the DUT 100, and port 3 of the second adapter 110 is connected to port 4 of the DUT 100. The intermediate step dictates that the indices of the S-parameters of the second adapter matrix, $S_Y$, change where index 1 becomes 2 and index 2 becomes 1. Similarly, index 3 becomes 4 and index 4 becomes 3. The first adapter matrix, $S_X$, remains unchanged, but the S-parameter elements of the second adapter matrix, $S_Y$, are re-positioned to reflect the interconnection change. Accordingly, the second adapter S-parameter matrix, $S_Y$, becomes:

$$\begin{bmatrix} S_{Y11} & S_{Y12} & S_{Y13} & S_{Y14} \\ S_{Y21} & S_{Y22} & S_{Y23} & S_{Y24} \\ S_{Y31} & S_{Y32} & S_{Y33} & S_{Y34} \\ S_{Y41} & S_{Y42} & S_{Y43} & S_{Y44} \end{bmatrix} \rightarrow \begin{bmatrix} S_{Y22} & S_{Y21} & S_{Y24} & S_{Y23} \\ S_{Y12} & S_{Y11} & S_{Y14} & S_{Y13} \\ S_{Y42} & S_{Y41} & S_{Y44} & S_{43} \\ S_{Y32} & S_{Y31} & S_{Y34} & S_{Y33} \end{bmatrix}$$

The two adapter S-parameter matrices, therefore, are:

$$\begin{bmatrix} S_{X11} & S_{X12} & S_{X13} & S_{X14} \\ S_{X21} & S_{X22} & S_{X23} & S_{X24} \\ S_{X31} & S_{X32} & S_{X33} & S_{X34} \\ S_{X41} & S_{X42} & S_{X43} & S_{X44} \end{bmatrix} \text{ and } \begin{bmatrix} S_{Y22} & S_{Y21} & S_{Y24} & S_{Y23} \\ S_{Y12} & S_{Y11} & S_{Y14} & S_{Y13} \\ S_{Y42} & S_{Y41} & S_{Y44} & S_{Y43} \\ S_{Y32} & S_{Y31} & S_{Y34} & S_{Y33} \end{bmatrix}$$

The ports of the combined adapter 702 in FIG. 11 are mapped differently than in the example of FIG. 9. Specifically, ports 2, 3 and 4 of the first adapter 102 are mapped to ports 5, 3 and 7 of the combined adapter 702, respectively. Similarly, ports 1, 2, and 3 of the second adapter 110 are mapped to ports 6, 2, and 8 of the combined adapter 702, respectively. Accordingly, matrix, $S_a$, is built as:

$$\begin{bmatrix} S_{X11} & 0 & S_{X13} & 0 & S_{X12} & 0 & S_{X14} & 0 \\ 0 & S_{Y22} & 0 & S_{Y24} & 0 & S_{Y21} & 0 & S_{Y23} \\ S_{X31} & 0 & S_{X33} & 0 & S_{X32} & 0 & S_{X34} & 0 \\ 0 & S_{Y42} & 0 & S_{Y44} & 0 & S_{Y41} & 0 & S_{Y43} \\ S_{X21} & 0 & S_{X23} & 0 & S_{X22} & 0 & S_{X24} & 0 \\ 0 & S_{Y12} & 0 & S_{Y14} & 0 & S_{Y11} & 0 & S_{Y13} \\ S_{X41} & 0 & S_{X43} & 0 & S_{X42} & 0 & S_{X44} & 0 \\ 0 & S_{Y32} & 0 & S_{Y34} & 0 & S_{Y31} & 0 & S_{Y33} \end{bmatrix}$$

As previously disclosed, the 4×4 s-parameter matrix of the DUT, $S_D$, may be obtained by partitioning the adapter s-parameter matrix, $S_a$, converting to the respective T-parameters, and using the general equation:

$$S_D = (T_{a11} - S_c T_{a21})^{-1}(S_c T_{a22} - T_{a12})$$

to solve for $S_D$.

Figure 12:
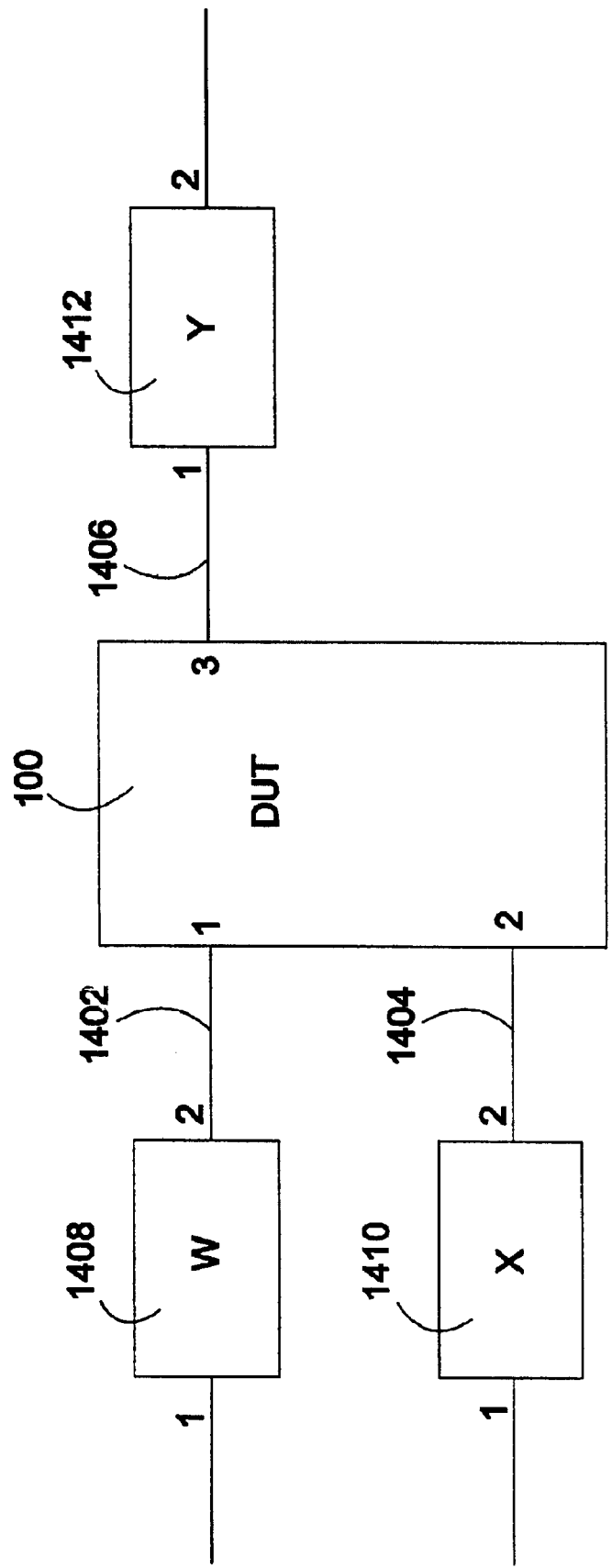
FIG. 12 illustrates a three port DUT with three two-port adapters.
Figure 13:
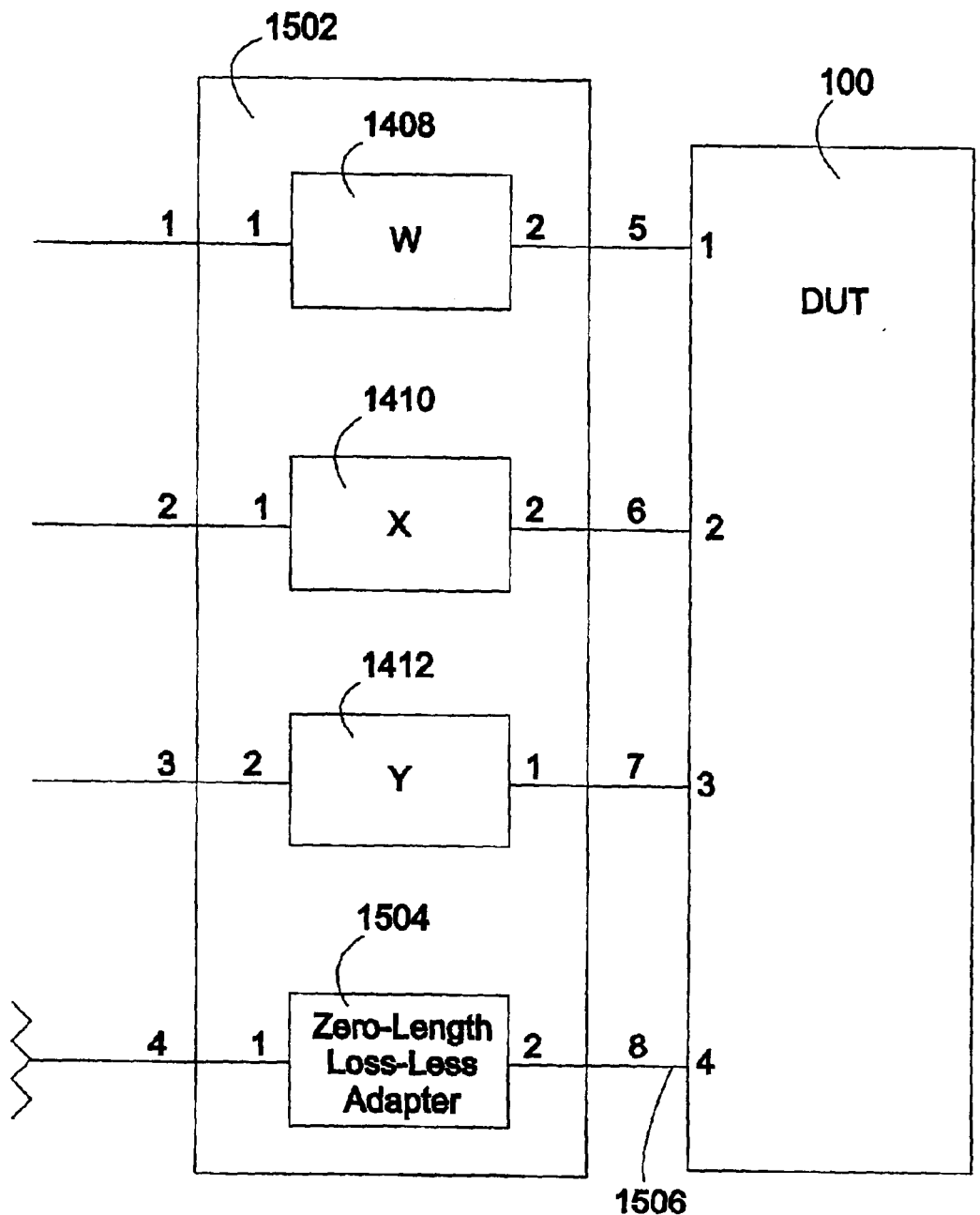
FIG. 13 illustrates the addition of a zero length loss less adapter to the combined adapter.

The discussion so far has been with respect to DUTs having an even number of device ports. There is a need, however, for the ability to de-embed a DUT having an odd number device ports. As an example, three port baluns, used extensively in differential circuit applications, provide a hardware transition from a single-ended to a balanced topology. The general solution presented herein may be adapted for use with DUTs having both an odd and an even number of device ports. With specific reference to FIG. 12 of the drawings, there is shown a DUT 100 having two input ports 1402, 1404 and a single output port 1406. Each port of the DUT 100 is also connected to first, second and third two port adapters 1408 (designated as adapter W), 1410 (designated as adapter X), and 1412 (designated as adapter Y). With specific reference to FIG. 13 of the drawings, the DUT 100 and adapters 1408 through 1412 are re-conceptualized as combined adapter 1502. A model of the combined adapter 1502 includes a zero-length, loss-less transmission line 1504 at an imaginary fourth DUT port 1506. The combined adapter 1502 is conceptualized as an eight-port adapter connected to a four port DUT 100. As one of ordinary skill in the art can appreciate, the reconceptualized configuration has a format that may be used with the general solution presented herein. The combined adapter matrix, $S_a$, is developed using the principles described herein as well as the S-parameters of the zero length, loss less transmission line, which is represented as:

$$\begin{bmatrix} 0 & 1 \\ 1 & 0 \end{bmatrix}$$

The combined adapter matrix, $S_a$, is built from the S-parameters of the constituent adapters 1408 through 1412 and the loss less transmission line 1504 where:

$$\begin{bmatrix} S_{W11} & 0 & 0 & 0 & S_{W12} & 0 & 0 & 0 \\ 0 & S_{X11} & 0 & 0 & 0 & S_{X12} & 0 & 0 \\ 0 & 0 & S_{Y22} & 0 & 0 & 0 & S_{Y21} & 0 \\ 0 & 0 & 0 & 0 & 0 & 0 & 0 & 1 \\ S_{W21} & 0 & 0 & 0 & S_{W22} & 0 & 0 & 0 \\ 0 & S_{X21} & 0 & 0 & 0 & S_{X22} & 0 & 0 \\ 0 & 0 & S_{Y12} & 0 & 0 & 0 & S_{Y11} & 0 \\ 0 & 0 & 0 & 1 & 0 & 0 & 0 & 0 \end{bmatrix}$$

The matrix that represents the cascaded combination of the DUT 100 and the combined adapter 1502 must also be adapted to a 4×4 matrix format. Accordingly, the fourth row and column of the cascaded matrix are loaded with zeros. $S_c$, therefore, is given by:

$$\begin{bmatrix} S_{c11} & S_{c12} & S_{c13} & 0 \\ S_{c21} & S_{c22} & S_{c23} & 0 \\ S_{c31} & S_{c32} & S_{c33} & 0 \\ 0 & 0 & 0 & 0 \end{bmatrix}$$

The general solution is then used with the adapted matrices, $S_a$ and $S_c$, to solve for the S-parameters of the DUT 100. The resulting matrix, $S_D$, comprises a 4×4 matrix format with zeros in the $4^{th}$ row and column. After arriving at the solution for $S_D$, the $4^{th}$ row and column may be discarded to arrive at the 3×3 S-parameter matrix that represents the electrical behavior of the DUT 100.

The method for applying the general case to any DUT and adapter configuration includes the addition of a conceptualized adapter with a zero length, loss less transmission line to achieve a DUT with an even number of device ports. If the DUT already has an even number of device ports, the addition of the zero length, loss less transmission line is unnecessary. The resulting DUT with an even number of device ports is cascaded with an adapter with twice as many adapter ports as the DUT. Accordingly, the zero length loss less transmission line is strategically placed to achieve a 2n-port DUT connected to a 4n-port combined adapter. Then the respective combined adapter matrix, $S_a$, may be built from the combination of the actual adapters and the conceptualized adapters comprising the zero length, loss less transmission lines. Similarly, the cascaded combination S-parameter matrix, $S_c$, having the necessary size is prepared. Additional elements receive a zero value if the cascaded combination matrix must be larger in order to fit within the proper format of a square matrix having 2n rows and columns, where n is an integer number. Accordingly, the representation of the DUT 100 has an even number of device ports. For example, a DUT with one input port and 3 output ports already has an even number of device ports and the embedding and de-embedding solutions presented herein may be used without the addition of the loss less transmission line. By contrast, a DUT with two input ports and three output ports calls for the addition of a conceptualized zero length loss less transmission line adapter. Specifically, the additional adapter is positioned at the input port. The result is a 6×6 S-parameter DUT matrix, a 6×6 cascaded combination matrix and a 12×12 combined adapter matrix for use in the general solution.

When the adapter matrix, $S_a$, is built, it is then partitioned and converted to the corresponding T-parameters or T-parameter sub-matrices. The T-parameters are then used to solve for SD using the general equation. Those S-parameters of the resulting DUT matrix that do not reflect the physical realities are discarded to arrive at the matrix that presents the electrical behavior of the DUT. The resulting S-parameter matrix of the DUT 100, $S_D$, may be used in the general equation together with S-parameters for a combined adapter to predict the behavior of the DUT 100 embedded in a modeled circuit.

Figure 14:
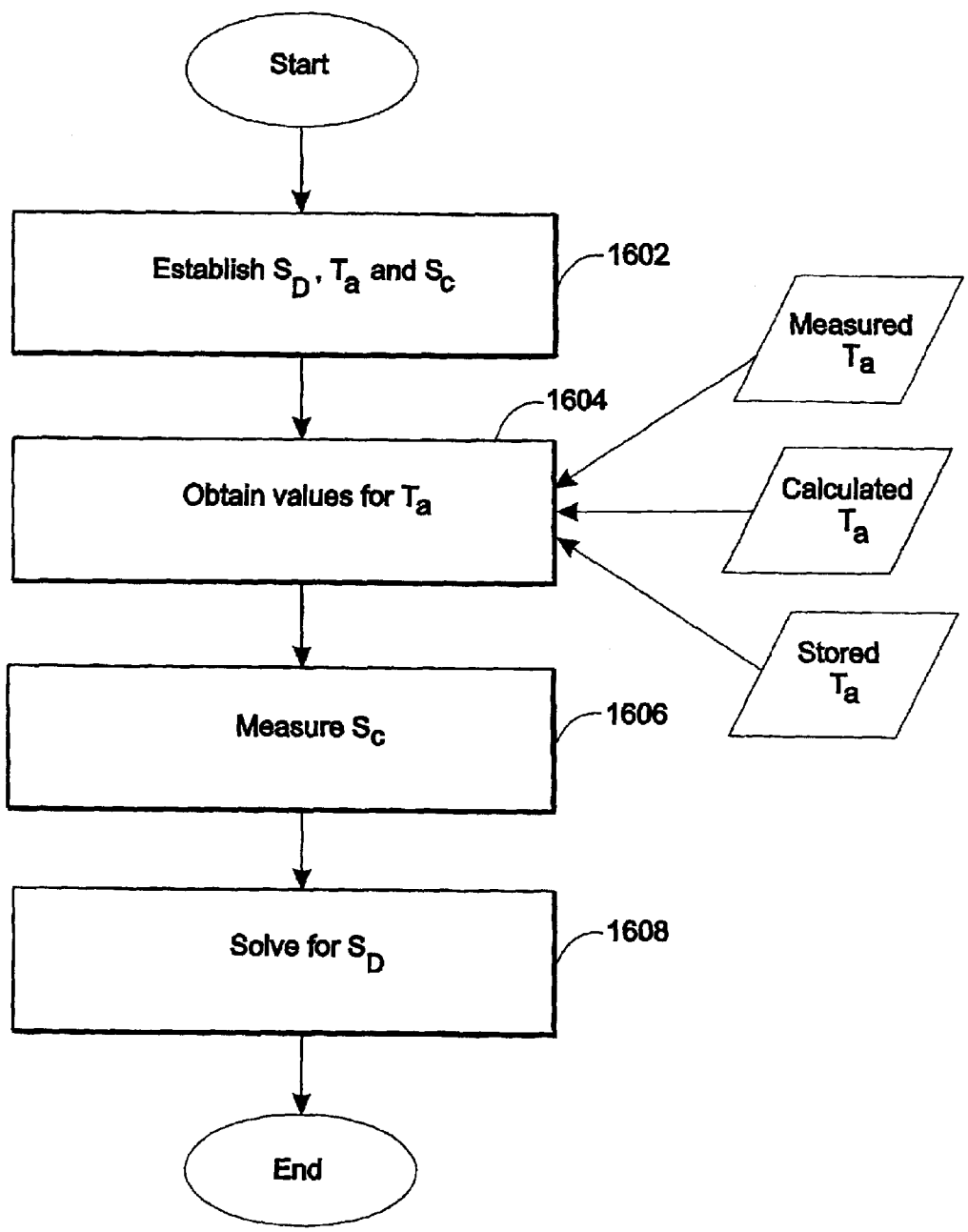
FIGS. 14 and 15 are flow charts of methods according to the teachings of the present invention.

In summary and with specific reference to FIG. 14 of the drawings, a method according to the teachings of the present invention first establishes matrices 1602 for the S-parameters for the DUT, $S_D$, the T-parameters for the combined adapter, $T_a$, and the S-parameters for the cascaded combination, $S_c$, of the DUT 100 with the combined adapter 702. Values are then obtained 1604 for the T-parameters of the combined adapter 702. As disclosed herein, there are a number of methods for obtaining these values including measurement of the combined adapter 702, building the S-parameter matrix from one or more S-parameter matrices of one or more constituent adapters of the combined adapter and converting to T-parameters, calculating the T-parameters, or recalling stored values from a data file. The S-parameters of the cascaded combination of the DUT 100 and combined adapter 702 is then measured 1606. The S-parameters for the de-embedded DUT may then be solved 1608.

Figure 15:
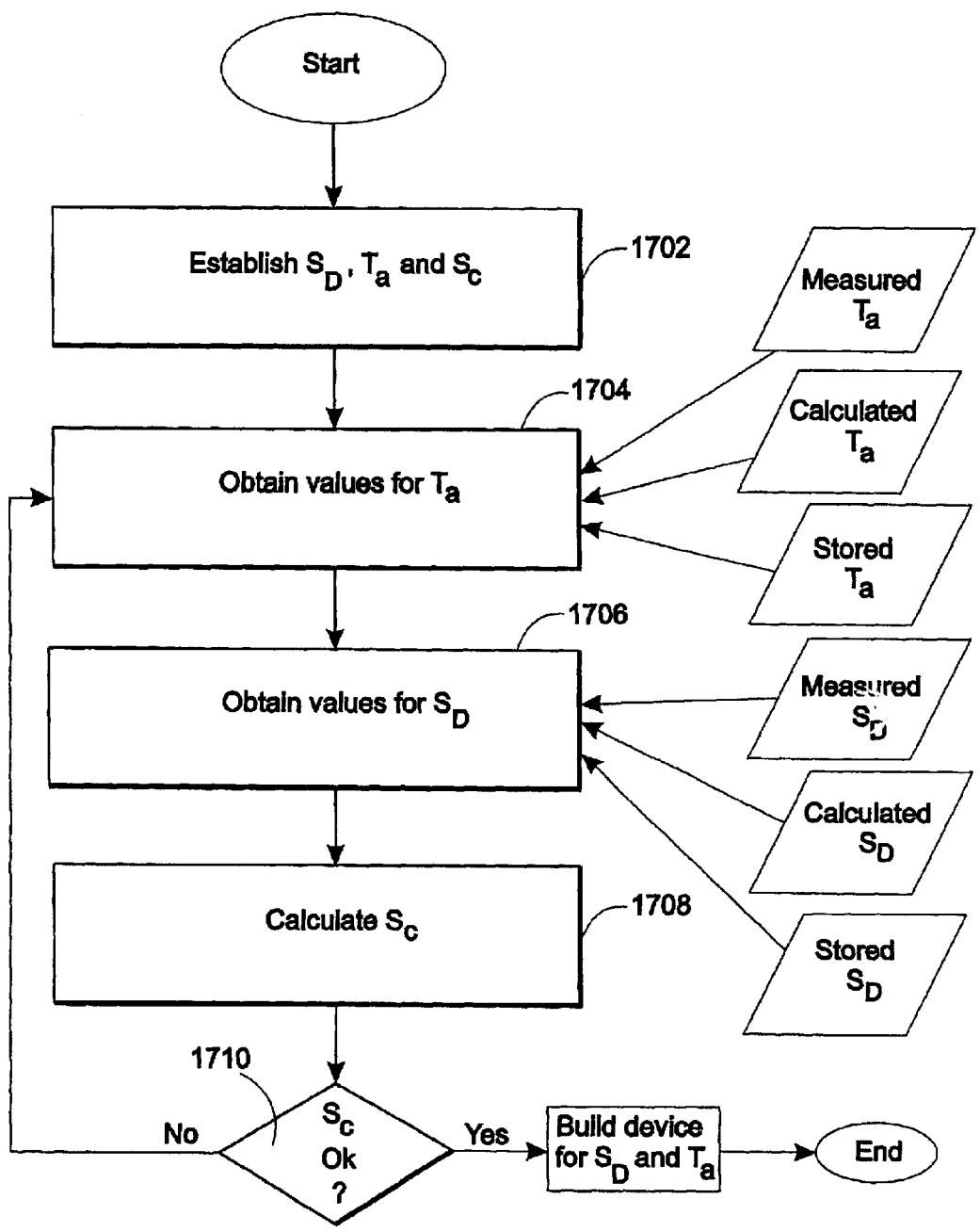

According to another aspect of the invention, the resulting S-parameter matrix of the DUT 100, SD, may be used to predict electrical behavior of the DUT 100 in combination with other circuits. The predictive method uses the general equation:

$$S_c = (T_{a11} S_D + T_{a12})(T_{a21} S_D + T_{a22})^{-1}$$

where $T_a$ is the adapter T-parameter matrix that represents the electrical behavior of the circuit in cascaded combination with the DUT 100. With specific reference to FIG. 15 of the drawings, there is shown a method according to the teachings of the present invention in which N×N matrices are established 1702 for the DUT 100 and the cascaded combination of the DUT 100 and the combined adapter 702. The T-parameter matrix of the combined adapter, $T_a$, is obtained 1704 either from a measurement of one or more existing adapters together with the build process disclosed herein, is calculated from a model of one or more existing adapters, or is a combination of both. Similarly, the S-parameters for the DUT 100 may be obtained 1706 from the characterization method disclosed herein or retrieved from a data file that stored previously extracted characterization data. Additionally, the S-parameters of the DUT may be measured or calculated. The cascaded S-parameters, $S_c$, represent the resulting combination of the DUT 100 and the combined adapter 702. Based on the T-parameter matrix and the DUT matrix obtained in steps 1704 and 1706, the S-parameters of the cascaded combination may be calculated 1708. The resulting cascaded S-parameters, $S_c$, are then evaluated against an expected result at 1710. If the result is unsatisfactory for the intended circuit, a prototype is not built. Instead, the combined adapter is adjusted, new T-parameters are obtained, and the process repeats. The process iterates until it yields satisfactory S-parameters for the cascaded combination. When the predicted results are acceptable, then a prototype may be built and tested for adherence to the expected characteristics. This process improves the likelihood of satisfactory prototypes thereby reducing the time and cost of developing devices and circuits that perform according to stated specifications.

Embodiments of the methods described herein are implemented using a personal computer with a Microsoft Windows operating system using Microsoft Visual Studio 6.0, Roguewave Stingray Studio, Roguewave Math H++, and the Victor Imaging Processing Library. Embodiments have also been implemented using HP Rocky Mountain Basic software. In one embodiment, a first programming unit implements equipment control, measurement, and data gathering steps. A result of the first programming unit is a data file including raw measurement data. In a second programming unit, the data file is read and the data is error corrected. The system then performs analysis steps on the error corrected data. As one of ordinary skill in the art appreciates, however, embodiments of the methods described may also be implemented in Rocky Mountain Basic programming language. Additionally, as long as the data format may be shared by multiple programming languages, the first programming unit and the second programming unit may be performed on different processors and may be implemented in different programming languages. Multiple variations of implementation will occur to those of ordinary skill in the art with the benefit of the present teachings.

Embodiments of the invention have been described herein by way of example and in conjunction with accompanying drawings. The description herein is illustrative of certain preferred embodiments, but the scope of the invention is limited only by the appended claims.

What is claimed is:

1. A method of characterizing a device having an odd number of device ports comprising the steps of:

establishing a device S-parameter matrix (SD) to represent electrical behavior of said device, an adapter T-parameter matrix ($T_a$) to represent all possible electrical paths through one or more circuits to all of the device ports, and a cascaded S-parameter matrix ($S_c$) to represent said one or more circuits cascaded with said device, obtaining values for said adapter T-parameter matrix to represent electrical behavior of said one or more circuits, measuring said device cascaded with said one or more circuits to obtain values for said cascaded S-parameter matrix, and solving for said device S-parameter matrix as a function of said adapter T-parameter matrix and said cascaded S-parameter matrix, wherein said step of establishing said adapter T-parameter matrix comprises modeling said device with an additional device port and including as part of said adapter T-parameter matrix for said one or more circuits values that represent a zero length, loss-less transmission line connected to said additional device port and terminated in a perfect load.

2. A method of characterizing as recited in claim 1 herein said device S-parameter matrix represents an N-port device and said adapter T-parameter matrix represents a 2N-port adapter where N is an even number.

3. A method of characterizing a device having an odd number of device ports comprising the steps of:

establishing a device S-parameter matrix ($S_D$) to represent electrical behavior of said device, an adapter T-parameter matrix ($T_a$) to represent all possible electrical paths through one or more circuits to all of the device ports, and a cascaded S-parameter matrix ($S_c$) to represent said one or more circuits cascaded with said device, obtaining values for said adapter T-parameter matrix to represent electrical behavior of said one or more circuits, measuring said device cascaded with said one or more circuits to obtain values for said cascaded S-parameter matrix, and solving for said device S-parameter matrix as a function of said adapter T-parameter matrix and said cascaded S-parameter matrix, wherein said cascaded S-parameter matrix comprises scattering parameter variables in as many rows as there are device ports and as many columns as there are device ports, said cascaded S-parameter matrix further comprising an additional row containing zero values for each matrix element in said additional row and an additional column containing zero values for each matrix element in said additional column.

4. A method of characterizing a device having an odd number of device ports comprising the steps of:

establishing a device S-parameter matrix ($S_D$) to represent electrical behavior of said device, an adapter T-parameter matrix ($T_a$) to represent all possible electrical paths through one or more circuits to all of the device ports, and a cascaded S-parameter matrix ($S_c$) represent said one or more circuits cascaded with said device, obtaining values for said adapter T-parameter matrix to represent electrical behavior of said one or more circuits, measuring said device cascaded with said one or more circuits to obtain values for said cascaded S-perameter matrix, and solving for said device S-parameter matrix as a function of said adapter T-parameter matrix and said cascaded S-parameter matrix, wherein said step of measuring said one or more circuits further comprises establishing an adapter S-parameter matrix to represent said all Possible electrical paths from said measuring device through said one or more circuits including said zero-length, loss-less transmission line, measuring to obtain values for elements that comprise said adapter S-parameter matrix, inserting appropriate values in said adapter S-parameter matrix to represent said zero-length, loss-less transmission line, and converting said resulting S-parameter matrix to said adapter T-parameter matrix.

5. A method of characterizing as recited in claim 4 wherein said step of solving further comprises the steps of:

partitioning said adapter S-parameter matrix into first ($S_{a11}$), second ($S_{a12}$), third ($S_{a21}$), and fourth ($S_{a22}$) sub-matrices, converting each said sub-matrix into a respective first ($T_{a11}$), second ($T_{a12}$), third ($T_{a21}$), and fourth ($T_{a22}$) transmission parameter sub-matrix, and solving for said device S-parameter matrix using the equation:

$$(T_{a11} - S_c T_{21})^{-1}(S_c T_{a22} - T_{a12}).$$

6. A method of characterizing electrical behavior of a device having an odd number of device ports, the method comprising the steps of:

establishing a device S-parameter matrix ($S_D$) having variable elements, establishing a single adapter S-parameter matrix ($S_a$) that represents all possible paths through one or more circuits cascaded with said device, and a cascaded S-parameter matrix ($S_c$), measuring S-parameters for said one or more circuits, assigning said S-parameters obtained in said step of measuring S-parameters for said one or more circuits to elements that comprise said adapter S-parameter matrix, measuring S-parameters for a cascaded combination of said device in electrical context with said one or more circuits, assigning said S-parameters obtained in said previous step of measuring to elements that comprise said cascaded S-parameter matrix, and solving for said device S-parameter matrix as a function of values in said adapter S-parameter matrix and said cascaded S-parameter matrix wherein said cascaded S-parameter matrix comprises scattering parameter variables in as many rows as there are device ports and as many columns as there are device ports, said cascaded S-parameter matrix further comprising an additional row containing zero values for each matrix element in said additional row and an additional column containing zero values for each matrix element in said additional column.

7. A method of characterizing electrical behavior of a device having an odd number of device ports, the method comprising the steps of:

establishing a device S-parameter matrix ($S_D$) having variable elements, establishing a single adapter S-parameter matrix ($S_a$) that represents all possible paths through one or more circuits cascaded with said device, and a cascaded S-parameter matrix ($S_c$), measuring S-parameters for said one or more circuits, assigning said S-parameters obtained in said step of measuring S-parameters for said one or more circuits to elements that comprise said adapter S-parameter matrix, measuring S-parameters for a cascaded combination of said device in electrical context with said one or more circuits, assigning said S-parameters obtained in said previous step of measuring to elements that comprise said cascaded S-parameter matrix, and solving for said device S-parameter matrix as a function of values in said adapter S-parameter matrix and said cascaded S-parameter matrix wherein said step of establishing said adapter S-parameter matrix further comprises modeling said device with an additional device port and including as part of said adapter S-parameter matrix for said one or more circuits values that represent a zero length, loss-less transmission line connected to said additional port and terminated in a perfect load.

8. A method of characterizing as recited in claim 7 wherein said step of establishing said adapter S-parameter matrix further comprises establishing said adapter S-parameter matrix to represent said all possible paths through said one or more circuits including said zero-length, loss-less transmission line, and wherein said step of measuring to obtain values for said adapter S-parameter matrix further comprises the steps of inserting appropriate values in certain elements of said S-parameter matrix to represent said zero-length, loss-less transmission line, partitioning said adapter scattering parameter matrix into first ($S_{a11}$), second ($S_{a12}$), third ($S_{a21}$), and fourth ($S_{a22}$) sub-matrices, converting each said sub-matrix into a respective first ($T_{a11}$), second ($T_{a12}$), third ($T_{a21}$), and fourth ($T_{a22}$) T-parameter sub-matrix, and solving for said device S-parameter matrix using the equation:

$$(T_{a11} - S_c T_{21})^{-1}(S_c T_{a22} - T_{a12}).$$

9. An article of manufacture comprising computer readable storage media including computer software embedded therein that causes a processing unit to perform the method comprising the steps of:
  establishing a device S-parameter matrix ($S_D$) to represent electrical behavior of a device, said device having an odd number of ports, an adapter T-parameter matrix ($T_a$) to represent all possible electrical paths through one or more circuits to all of the device ports, and a cascaded S-parameter matrix ($S_c$) to represent said one or more circuits cascaded with said device,
  obtaining values for said adapter T-parameter matrix to represent electrical behavior of said one or more circuits,
  measuring said device cascaded with said one or more circuits to obtain values for said cascaded S-parameter matrix, and
  solving for said device S-parameter matrix as a function of said adapter T-parameter matrix and said cascaded S-parameter matrix
  wherein said step of establishing said adapter T-parameter matrix comprises modeling said device with and additional device port and including as part of said adapter T-parameter matrix for said one or more circuits values that represent a zero length, loss-less transmission line connected to said additional port and terminated in a perfect load.

10. An article of manufacture as recited in claim 9 wherein said step of modeling further comprises including said one or more additional device ports such that said device T-parameter matrix represents a device having an even number of device ports and said adapter T-parameter matrix represents an adapter having twice as many adapter ports as said device ports.

11. An article of manufacture as recited in claim 9 wherein said cascaded S-parameter matrix comprises scattering parameter variables in as many rows as there are device ports and as many columns as there are device ports, said cascaded S-parameter matrix further comprising an additional row containing zero values for each matrix element in said additional row and an additional column containing zero values for each matrix element in said additional column.

12. An article of manufacture as recited in claim 9 wherein said device S-parameter matrix represents an N-port device and said adapter T-parameter matrix represents a 2N-port adapter where N is an even number.

13. An article of manufacture as recited in claim 12 wherein said step of measuring said one or more circuits further comprises establishing an adapter S-parameter matrix to represent said all possible electrical paths from said measuring device through said one or more circuits including said zero-length, loss-less transmission line, measuring to obtain values for elements that comprise said adapter S-parameter matrix, inserting appropriate values in said adapter S-parameter matrix to represent said zero-length, loss-less transmission line, and converting said resulting S-parameter matrix to said adapter T-parameter matrix.

14. An article of manufacture as recited in claim 13 wherein said step of solving further comprises the steps of:
  partitioning said adapter S-parameter matrix into first ($S_{a11}$), second ($S_{a12}$), third ($S_{a21}$), and fourth ($S_{a22}$) sub-matrices,
  converting each said sub-matrix into a respective first ($T_{a11}$), second ($T_{a12}$), third ($T_{a21}$), and fourth ($T_{a22}$) transmission parameter sub-matrix, and
  solving for said device S-parameter matrix using the equation:

$$(T_{a11} - S_c T_{21})^{-1}(S_c T_{a22} - T_{a12}).$$

15. An article of manufacture as recited in claim 13 wherein said step of establishing a T-parameter matrix comprises accommodating a transmission parameter value for all possible paths between said adapter and said embedded device including a path through said zero-length, loss-less transmission line.

* * * * *